United States Patent
Humfeld

(10) Patent No.: US 10,227,719 B2
(45) Date of Patent: Mar. 12, 2019

(54) INTERWOVEN CARBON NANOTUBE MATS

(71) Applicant: The Boeing Company

(72) Inventor: Keith Daniel Humfeld, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 59 days.

(21) Appl. No.: 15/390,602

(22) Filed: Dec. 26, 2016

(65) Prior Publication Data

US 2017/0283263 A1 Oct. 5, 2017

Related U.S. Application Data

(63) Continuation-in-part of application No. 15/086,458, filed on Mar. 31, 2016.

(51) Int. Cl.

| | |
|---|---|
| *B32B 9/00* | (2006.01) |
| *D05B 19/12* | (2006.01) |
| *C01B 32/16* | (2017.01) |
| *C01B 32/174* | (2017.01) |
| *C23C 16/26* | (2006.01) |
| *C01B 32/162* | (2017.01) |
| *B82Y 30/00* | (2011.01) |

(52) U.S. Cl.
CPC .............. *D05B 19/12* (2013.01); *C01B 32/16* (2017.08); *C01B 32/162* (2017.08); *C01B 32/174* (2017.08); *C23C 16/26* (2013.01); *B82Y 30/00* (2013.01); *C01B 2202/08* (2013.01); *Y10T 428/30* (2015.01)

(58) Field of Classification Search
CPC ..... C01B 31/04; C01B 31/022–31/293; Y10T 428/30; B82Y 30/00
USPC ................ 428/408; 423/447.1, 448; 252/501
See application file for complete search history.

(56) References Cited

U.S. PATENT DOCUMENTS

| | | | |
|---|---|---|---|
| 2005/0095938 A1 | 5/2005 | Rosenberger et al. | |
| 2007/0117488 A1 | 5/2007 | Yokoh et al. | |
| 2009/0152773 A1* | 6/2009 | Barinov ............... | D01D 5/0092 264/465 |
| 2011/0070370 A1* | 3/2011 | Teo ........................ | C23C 16/452 427/255.28 |

(Continued)

OTHER PUBLICATIONS

Joseph F. Aubuchon et al; Electric-Field-Guided Growth of Carbon Nanotubes during DC Plasma-Enhanced CVD; Chemical Vapor Deposition; www.cvd-jounal.de; 2006.

(Continued)

*Primary Examiner* — Daniel H Miller
(74) *Attorney, Agent, or Firm* — Duft & Bornsen, PC

(57) ABSTRACT

Systems and methods are provided for stitching together sheets of interwoven carbon nanotubes. One embodiment is a method that includes providing multiple sheets of interwoven carbon nanotubes, arranging the sheets over a substrate such that interstices of the sheets overlap at a stitch region of the substrate and heating catalysts at the substrate above a threshold temperature to trigger growth of new carbon nanotubes. The method also includes adjusting alignment of an electrical field that defines a direction of growth of the new carbon nanotubes, thereby causing the new carbon nanotubes to grow through the interstices and then stitch the sheets together.

25 Claims, 28 Drawing Sheets

(56) References Cited

U.S. PATENT DOCUMENTS

2011/0253907 A1* 10/2011 Qian .................. H01J 37/20
                                                              250/491.1
2011/0291315 A1* 12/2011 Roberts ............... D04H 1/4382
                                                              264/108
2016/0221829 A1    8/2016 Humfeld

OTHER PUBLICATIONS

Kai Wang et al; High-Performance Two-Ply Yarn Supercapacitors Based on Carbon Nanotubes and Polyaniline Nanowire Arrays; Advanced Materials; www.MaterialsViews.com 2013.
Optical properties of carbon nanotubes; Wikipedia, the free encyclopedia; Feb. 16, 2016.
Rufan Zhang et al; Growth of Half-Meter Long Carbon Nanotubes Based on Schulz-Flory Distribution; vol. 7 No. 7 5156-6161 2013; www.acsnano.org.
Spinning continuous carbon nanotube yarns; Nature Publishing Group, vol. 419, Oct. 24, 2002.
Stuart Mason Dambrot; Of catalysts and chirality: Highly-selective growth of structure-specific single-walled carbon nanotubes; Jul. 16, 2014; http://ohys.org/news/2014-07.
Super-tough carbon-nanotube fibres; Nature Publishing Group, vol. 423, Jun. 12, 2003.
Vladimir V. Tsukruk et al; Nanotube Surface Arrays: Weaving, Bending, and Assembling on Patterned Silicon; Physical Review Letters; vol. 92, No. 6, Feb. 13, 2004.
U.S. Appl. No. 15/280,096.
U.S. Appl. No. 14/611,734.
U.S. Appl. No. 15/086,458.

\* cited by examiner

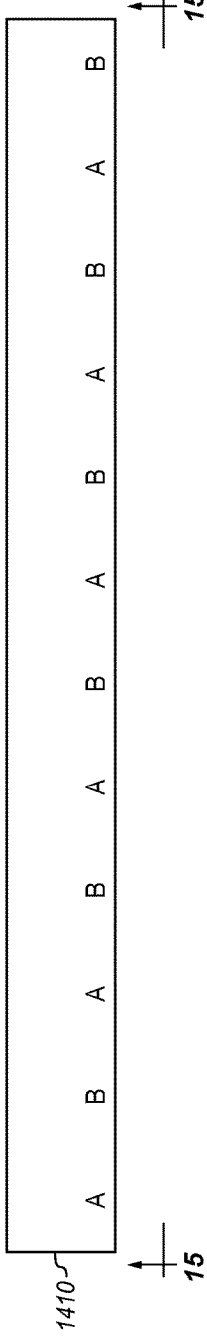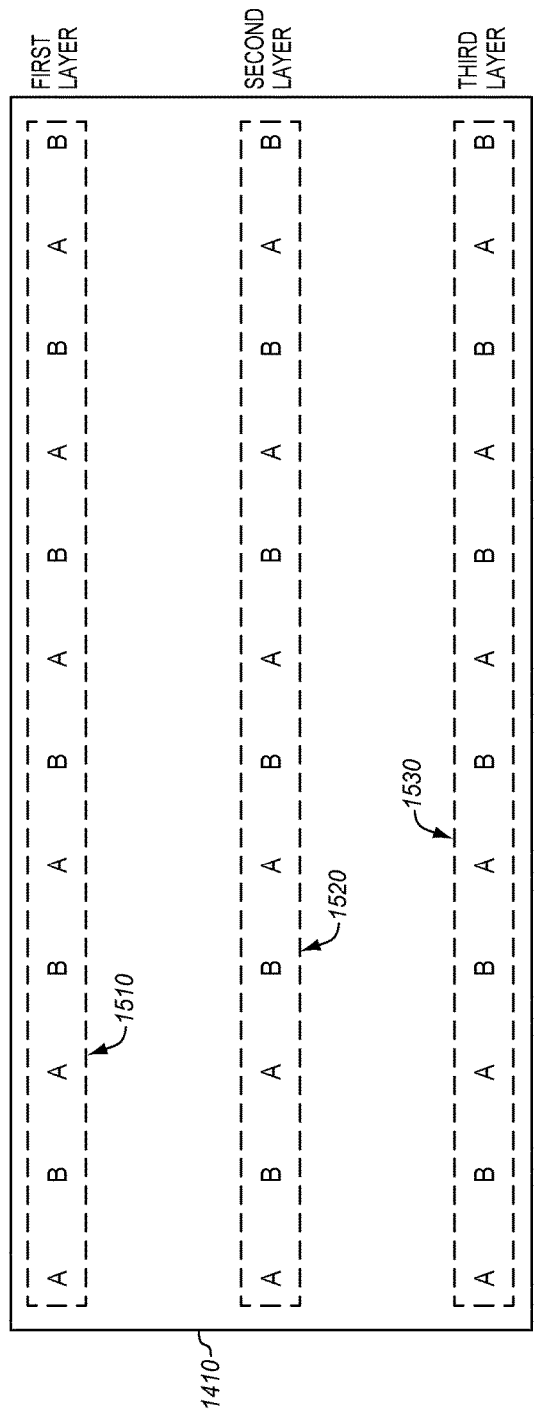

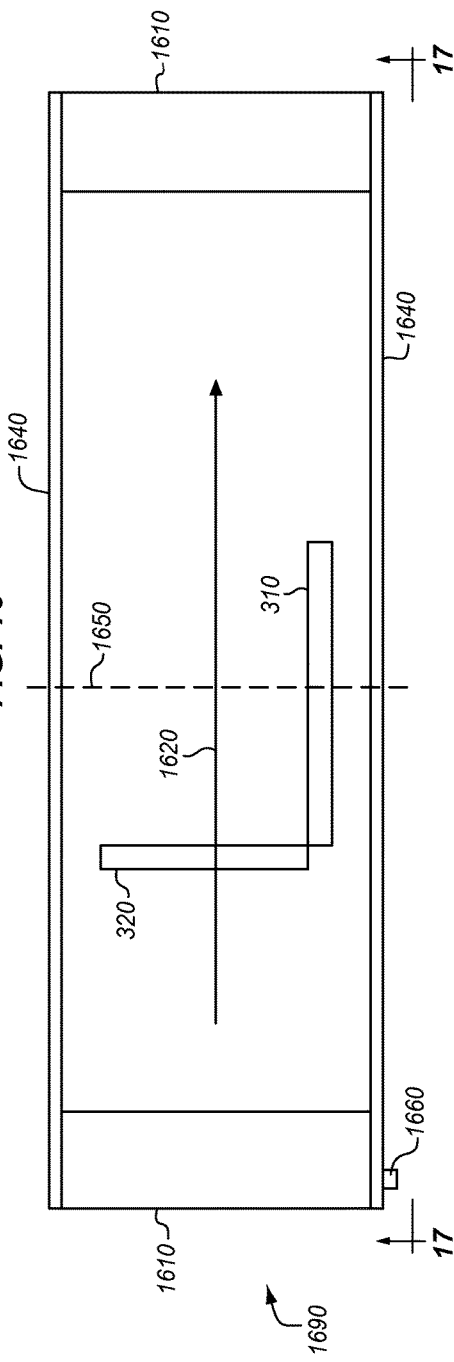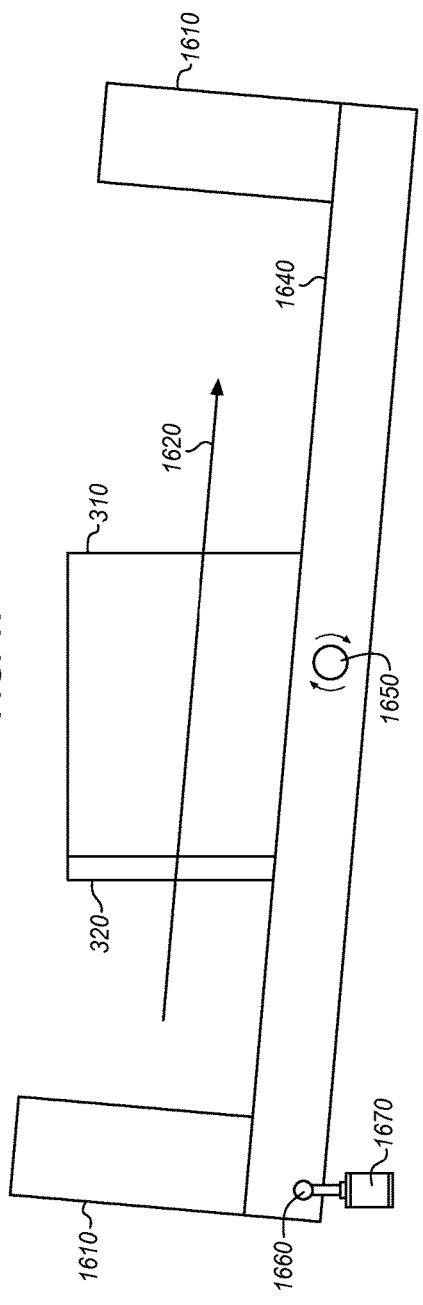

INTERWOVEN CARBON NANOTUBE MATS

FIELD

The disclosure relates to the field of materials science, and in particular, to carbon nanotubes.

BACKGROUND

Carbon nanotubes are resilient materials that are noted for their incredible strength and flexibility. However, carbon nanotubes are small (e.g., having a width on the order of nanometers), which makes it hard to harness their properties in products that are implemented on larger scales such as the meter scale. For example, carbon nanotubes may be bundled into large sheets/mats that use a binder to hold the nanotubes together. The strength of these mats is dependent upon the strength of the binder holding the nanotubes together.

Since carbon nanotubes continue to exhibit extraordinary strength and other desirable properties, it remains desirable to develop materials that are capable of exhibiting a similar strength on the macroscopic level.

SUMMARY

Embodiments described herein include techniques for stitching together sheets of interwoven carbon nanotubes. Stitching together small individual sheets made from resilient interwoven carbon nanotubes allows for the creation of large scale sheets exhibiting desired levels of strength.

One embodiment is a method that includes providing multiple sheets of interwoven carbon nanotubes, arranging the sheets over a substrate such that interstices of the sheets overlap at a stitch region of the substrate and heating catalysts at the substrate above a threshold temperature to trigger growth of new carbon nanotubes. The method also includes adjusting alignment of an electrical field that defines a direction of growth of the new carbon nanotubes, thereby causing the new carbon nanotubes to grow through the interstices and then stitch the sheets together.

A further embodiment is a non-transitory computer readable medium embodying programmed instructions which, when executed by a processor, are operable for performing a method for stitching multiple sheets of interwoven carbon nanotubes arranged over a substrate such that interstices of the sheets partially overlap at a stitch region of the substrate. The method includes heating catalysts at the substrate above a threshold temperature to trigger growth of new carbon nanotubes, and adjusting alignment of an electrical field that defines a direction of growth of the new carbon nanotubes, thereby causing the new carbon nanotubes to grow through the interstices and then stitch the sheets together.

A further embodiment is a system for stitching together sheets of interwoven carbon nanotubes. This system includes a substrate comprising multiple catalysts that grow carbon nanotubes, the substrate dimensioned to receive multiple sheets of interwoven carbon nanotubes having interstices that overlap at a stitch region of the substrate. The system also includes a heating device that heats catalysts at the substrate above a threshold temperature to trigger growth of new carbon nanotubes, and an electromagnetic source that generates an electrical field defining a direction of growth of the new carbon nanotubes. The system further includes an actuator that reorients the electromagnetic source, and a controller that directs the actuator to adjust alignment of the electrical field as growth continues, thereby causing the new carbon nanotubes to grow through the interstices and then stitch the sheets together.

Other exemplary embodiments (e.g., methods and computer-readable media relating to the foregoing embodiments) may be described below. The features, functions, and advantages that have been discussed can be achieved independently in various embodiments or may be combined in yet other embodiments further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

FIGS. 14-15 are diagrams illustrating a substrate capable of growing multiple layers of carbon nanotubes at once in an exemplary embodiment.

FIGS. 16-17 are diagrams illustrating motion of an electric field generator about substrates for growing carbon nanotubes in an exemplary embodiment.

DESCRIPTION

The figures and the following description illustrate specific exemplary embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
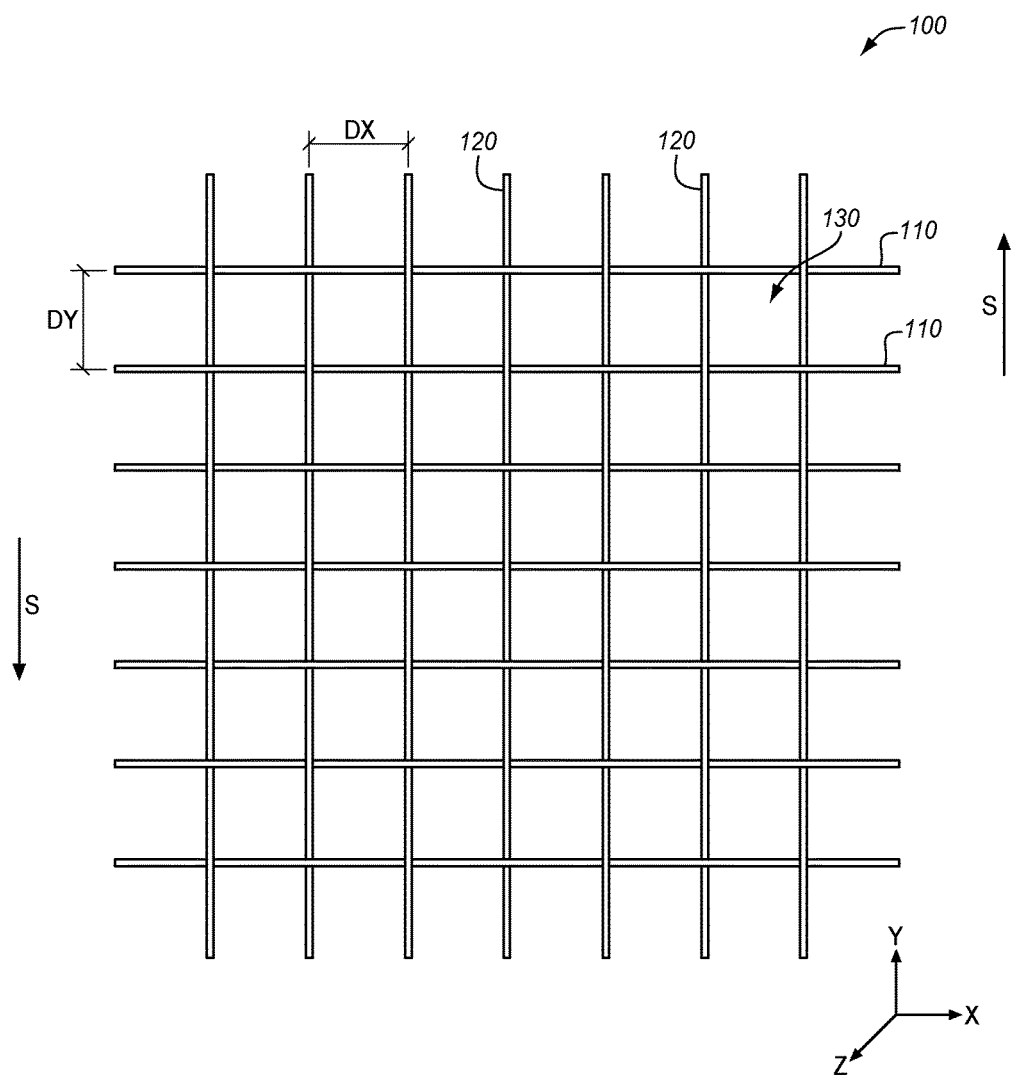
FIG. 1 is a diagram illustrating an interwoven sheet of carbon nanotubes in an exemplary embodiment.

FIG. 1 is a diagram illustrating an interwoven sheet 100 of carbon nanotubes in an exemplary embodiment. In FIG. 1, nanotubes 110 running horizontally are interweaved with nanotubes 120 running vertically. Nanotubes 110 are uniformly separated from each other by distance DY, while nanotubes 120 are uniformly separated by DX, which may equal DY. When shear forces (S) are applied to sheet 100, those shear forces are borne by nanotubes 110. This causes sheet 100 to exhibit a high strength. That is, the strength of sheet 100 results from the strength of the nanotubes that it is made from, in that the high strength is due to load being directly borne by the carbon nanotubes rather than a binder material in which sheet 100 may be integrated. If the woven structure of sheet 100 was not used, it would not be as strong. The following description and figures illustrate systems and methods for creating such interwoven sheets of carbon nanotubes.

Figure 2:
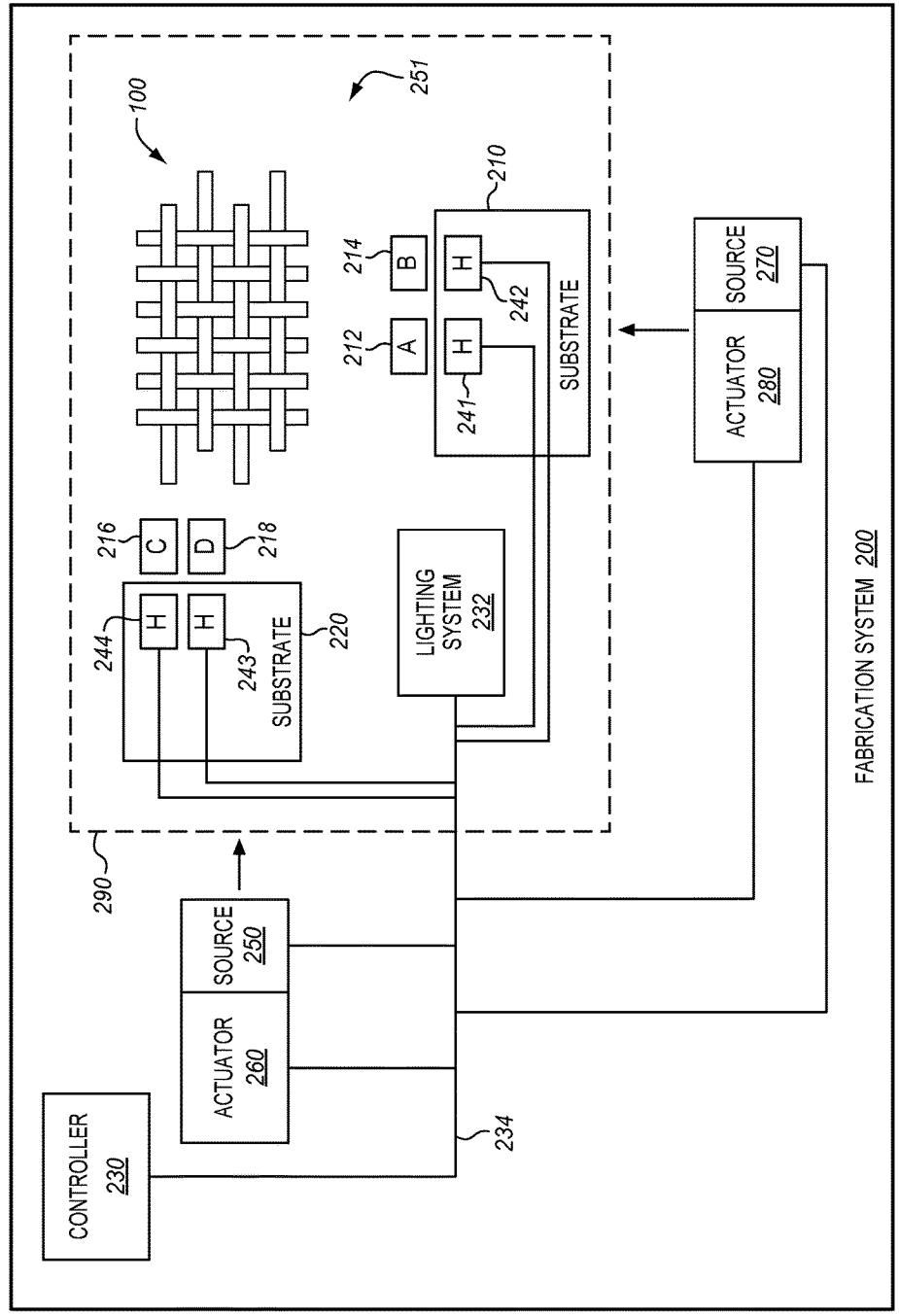
FIG. 2 is a block diagram illustrating a fabrication system for carbon nanotubes in an exemplary embodiment.

FIG. 2 is a block diagram illustrating a fabrication system 200 for creating woven sheets of carbon nanotubes in an exemplary embodiment. Fabrication system 200 comprises any system capable of weaving carbon nanotubes together as those nanotubes are grown via Chemical Vapor Deposition (CVD) processes. In this embodiment, fabrication system 200 includes CVD chamber 290, in which multiple substrates (210, 220) are placed. Substrate 210 includes catalysts 212 and 214, and substrate 220 includes catalysts 216 and 218. The catalysts (212, 214, 216, 218) facilitate carbon nanotube growth via CVD processes. In this embodiment, each catalyst corresponds with a different chirality of carbon nanotube. Thus, catalyst 212 grows chirality A, catalyst 214 grows chirality B, catalyst 216 grows chirality C, and catalyst 218 grows chirality D. As used herein, different "chiralities" of carbon nanotubes are carbon nanotubes that have distinct pairs of chiral numbers m and n, denoted as (n,m). These variables n and m characterize a nanotube by serving as unit vectors along different directions in a crystal lattice formed by a carbon nanotube. During fabrication, there may be many catalysts of each chirality, and catalysts of different chiralities may alternate with respect to each other when placed on the same substrate.

Fabrication system 200 also includes systems that selectively trigger and direct growth from each of the catalysts (212, 214, 216, 218). That is, controller 230 may operate heaters 241-244 in order to selectively heat individual catalysts to a threshold temperature that triggers CVD processes. Alternatively or additionally, controller 230 may operate lighting system 232 to apply light at wavelengths that energize and heat certain chiralities (e.g., A) without increasing the temperature of other chiralities (e.g., B, C, D) above a threshold temperature. Controller 230 may be implemented, for example, as custom circuitry, as a processor executing programmed instructions, or some combination thereof.

As controller 230 selectively triggers the growth of individual catalysts (or sets of catalysts), controller 230 may operate one or more electric field sources (250, 270) in order to generate electrical fields. As carbon nanotube growth occurs within interior 251 of CVD chamber 290 to form sheet 100, the carbon nanotubes will grow parallel to the applied electrical fields. Controller 230 may further operate actuators (e.g., 260, 280) in order change the direction of the electrical fields as growth continues (e.g., simultaneously with the growth of the carbon nanotubes, or in between growth phases before the carbon nanotubes have finished growing to their intended length). This may ensure that different chiralities and/or sets of nanotubes grow in different directions.

By selectively growing different sets of nanotubes, and by controlling the direction of growth of each set of nanotubes via electric field sources 250 and 270, controller 230 may interweave different carbon nanotubes together in any suitable pattern (e.g., a plain weave, a twill weave, a satin weave, etc.). This provides a substantial benefit by enhancing the strength of layers of materials that utilize carbon nanotubes.

Illustrative details of the operation of fabrication system 200 will be discussed with regard to FIG. 3. Assume, for this embodiment, that catalysts A and B are arranged in an alternating/interspersed pattern on substrate 210 and that catalysts C and D are arranged in an alternating pattern on substrate 220 (e.g., as shown in FIG. 4). The catalysts arranged on substrates 210 and 220 are substantially coplanar, and substrates 210 and 220 are separated by an angle θ (e.g., ninety degrees).

Figure 3:
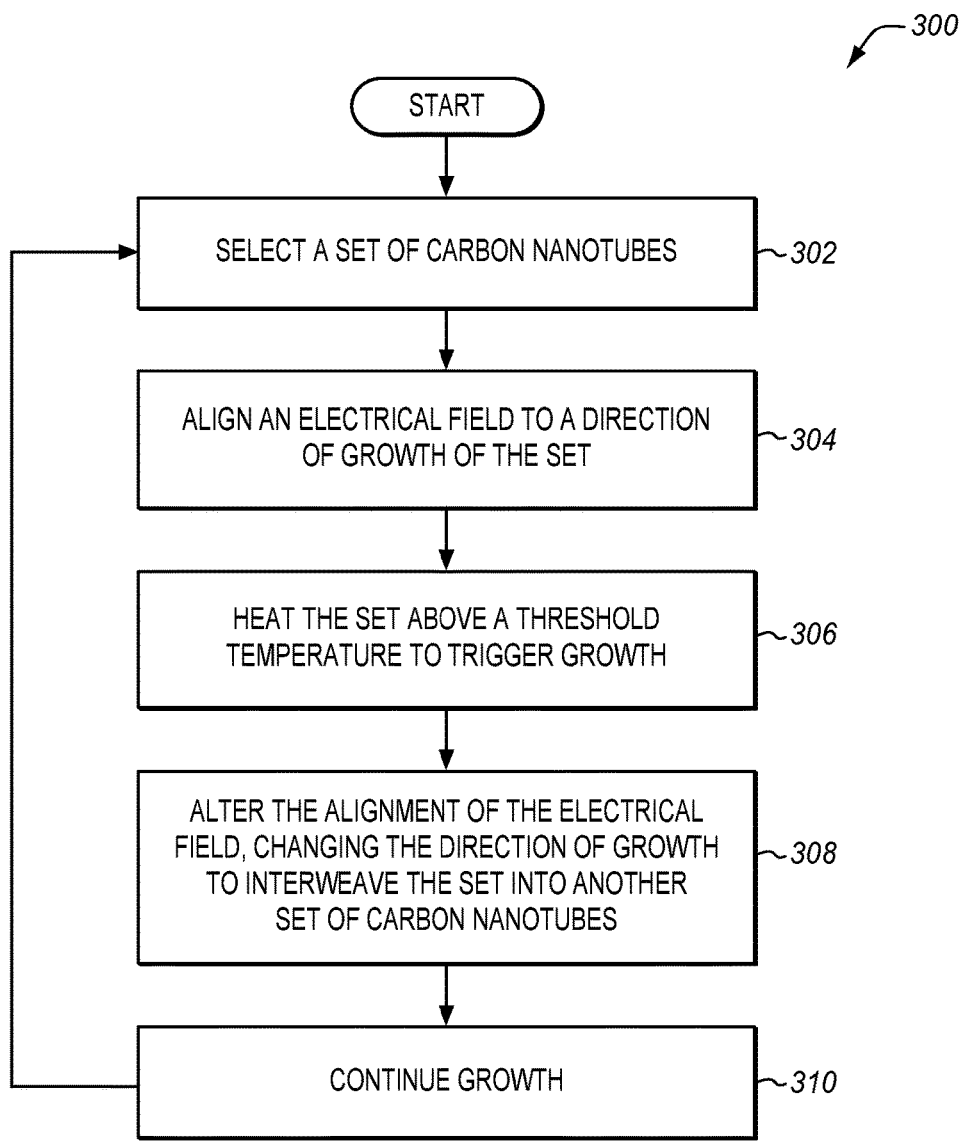
FIG. 3 is a flowchart illustrating a method for growing carbon nanotubes into an interweaved layer in an exemplary embodiment.
Figure 4:
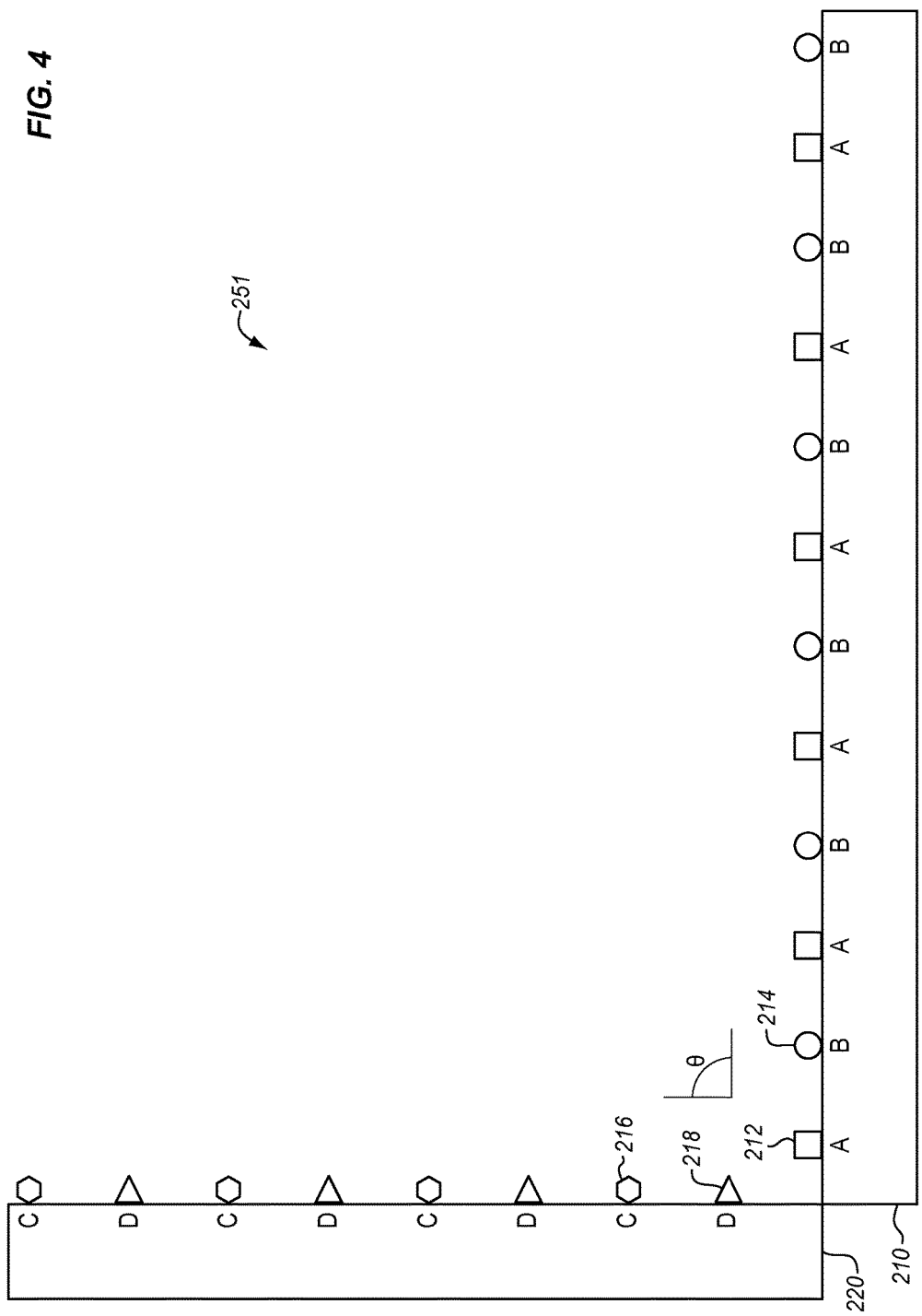
FIGS. 4-10 illustrate growth of an interweaved layer of carbon nanotubes in an exemplary embodiment.

FIG. 3 is a flowchart illustrating a method 300 for growing carbon nanotubes into an interweaved layer in an exemplary embodiment. The steps of method 300 are described with reference to fabrication system 200 of FIG. 2, but those skilled in the art will appreciate that method 300 may be performed in other systems. The steps of the flowcharts described herein are not all inclusive and may include other steps not shown. The steps described herein may also be performed in an alternative order.

Figure 5:
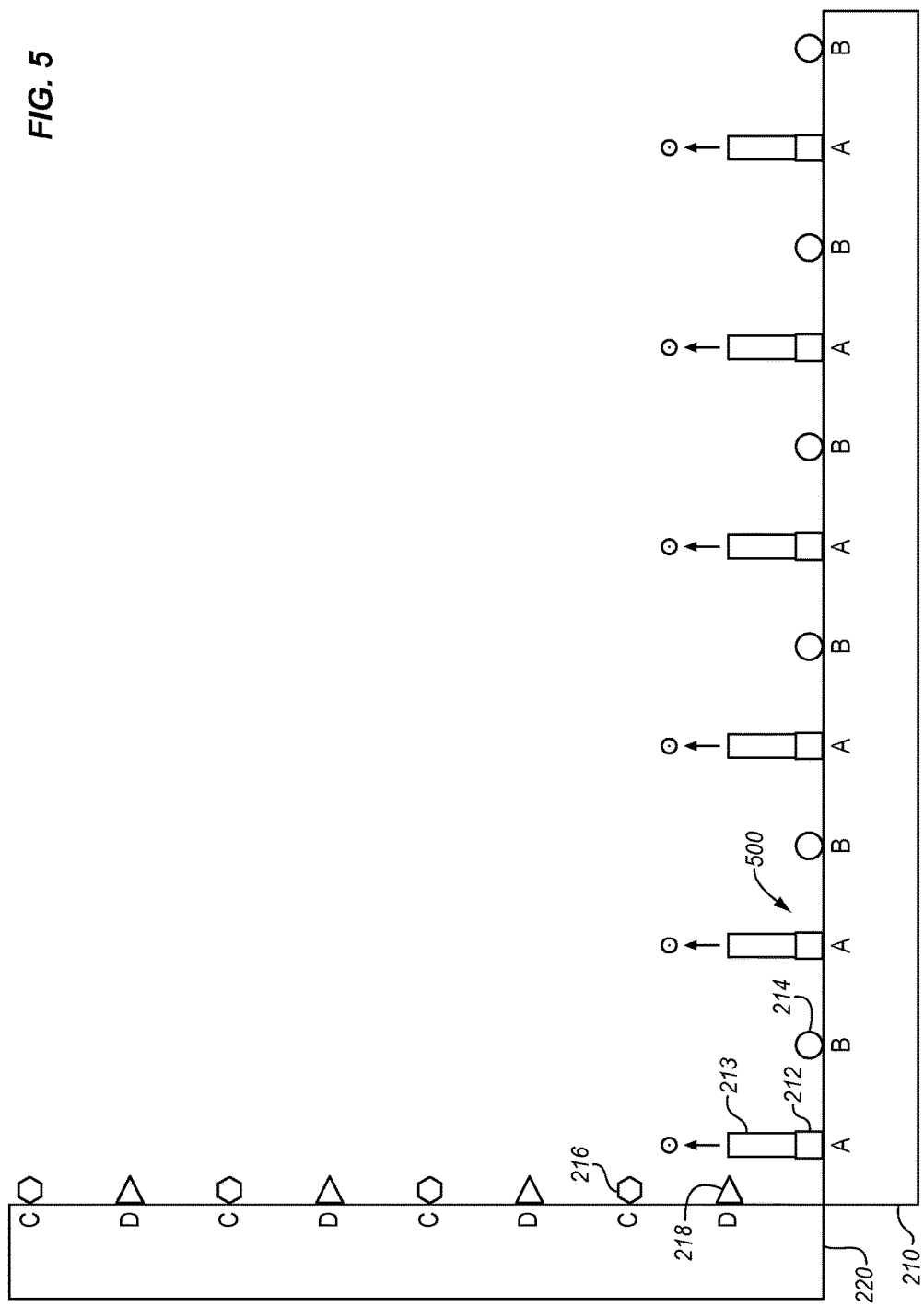

In order to initiate the process, controller 230 selects a set of carbon nanotubes to grow (step 302). In this case, nanotubes 213 having chirality A (which grow from catalysts 212) are chosen for growth, as shown in FIG. 5. As shown in FIG. 5 and following figures, the size of individual carbon nanotubes has been substantially exaggerated in order to clarify in the weaving processes described herein.

Controller 230 directs one or more actuators (e.g., 280, 260) and/or electric field sources (e.g., 250, 270) to align an electrical field in a desired direction of growth for the selected set of carbon nanotubes (step 304). In this case, the nanotubes will be grown upward along the page, and into the page as shown by the vectors illustrated in FIG. 5. Hence, controller 230 instructs actuators (e.g., 280, 260) and/or electric field sources/generators (e.g., 250, 270) to align an electrical field in the desired direction.

With the electrical field aligned properly, nanotubes growing from catalysts 212 will grow in the expected direction. Thus, controller 230 directs elements of fabrication system 200 (e.g., heaters 241-244, or lighting system 232) to heat catalysts 212 above a threshold temperature in order to trigger parallel nanotube growth in the desired direction via CVD processes (step 306). It should be noted that in embodiments which utilize a lighting system to apply heat, the lighting system heats carbon nanotubes, which transfer heat to their corresponding catalysts via conduction. Thus, as an initial step, it may be desirable to place substrates 210 and 220 into a heated oven to trigger a small amount of uniform growth at each of the catalysts, before utilizing the lighting system to heat individual chiralities. This ensures that there are carbon nanotubes for the lighting system to heat in step 306.

As used herein, the threshold temperature is a temperature at which growth continues at a non-negligible rate. While CVD processes may cause growth to occur for all carbon nanotubes at lower temperatures, the speed of this growth is orders of magnitude slower below a threshold temperature, and therefore not acceptable for fabrication purposes. For example, the threshold temperature may be selected to trigger growth in the range of several tens of microns per minute (e.g., a temperature of 650° C., 700° C., etc.). In one embodiment, the nanotubes are all kept at a temperature just below the threshold temperature (e.g., 20° C. below the threshold temperature), and then individual sets of nanotubes are heated above the threshold temperature to trigger growth at viable rates. Heating the first set of carbon nanotubes as shown in FIG. 5 causes the carbon nanotubes 213 to grow upward and out of the page towards the reader. At each carbon nanotube 213, carbon atoms are drawn out of the surrounding environment proximate to catalyst 212 at location 500. These carbon atoms are added to the carbon nanotubes 213, increasing their length in the direction of the electric field.

As growth continues (e.g., before the carbon nanotubes have completed growing to their intended length, or during a period of time at which the carbon nanotubes are over the threshold temperature and actively growing), controller 230 changes the direction by altering the alignment of the electrical field (step 308). This changes the direction of growth for the carbon nanotubes, which causes the carbon nanotubes to interweave with another set of carbon nanotubes. As the direction of the electric field changes, the direction in which the carbon nanotubes grow also changes. In this manner, by oscillating the direction of the electric field as carbon nanotubes grow, the carbon nanotubes may form sinusoids along their length.

Figure 6:
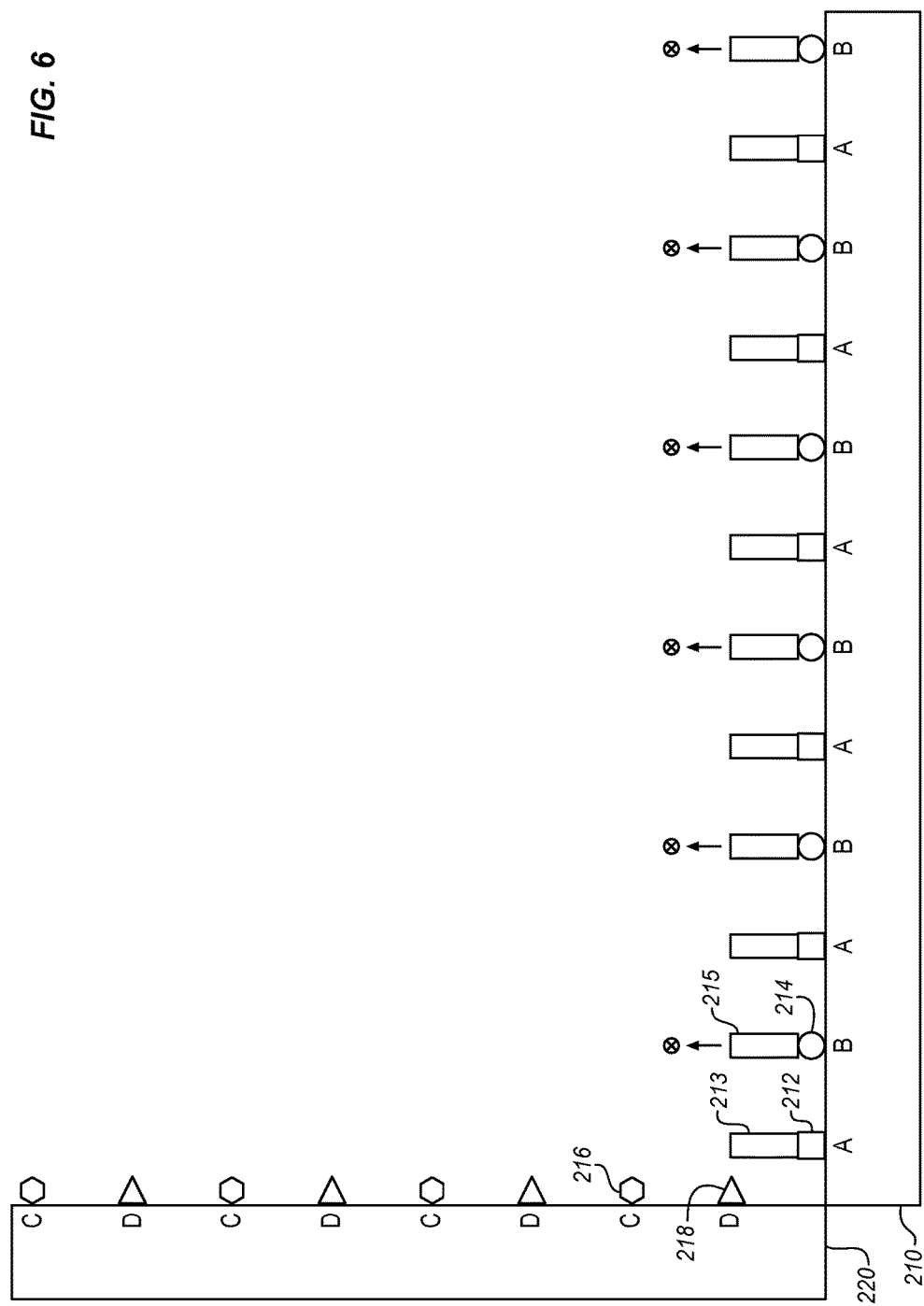
Figure 7:
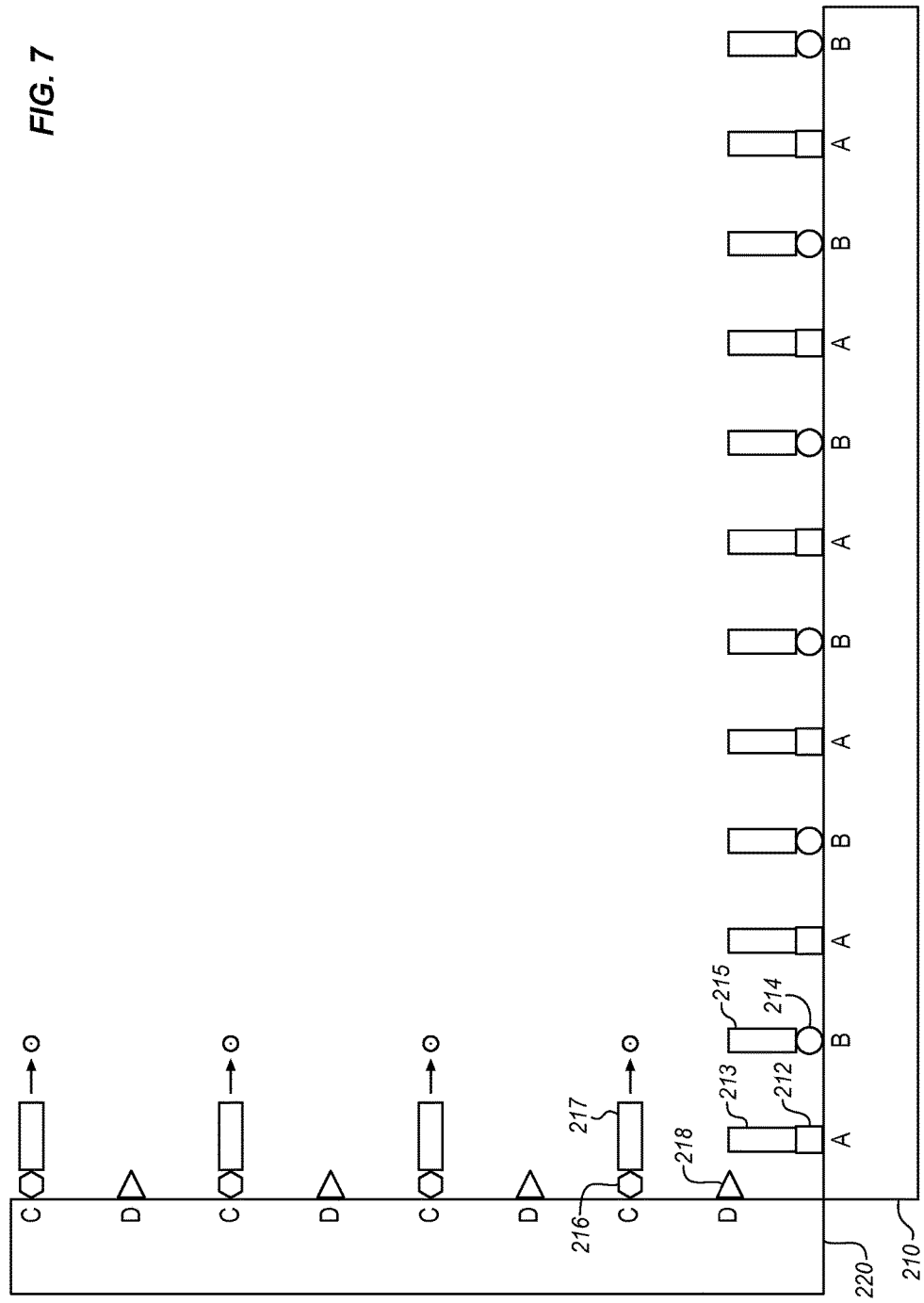
Figure 8:
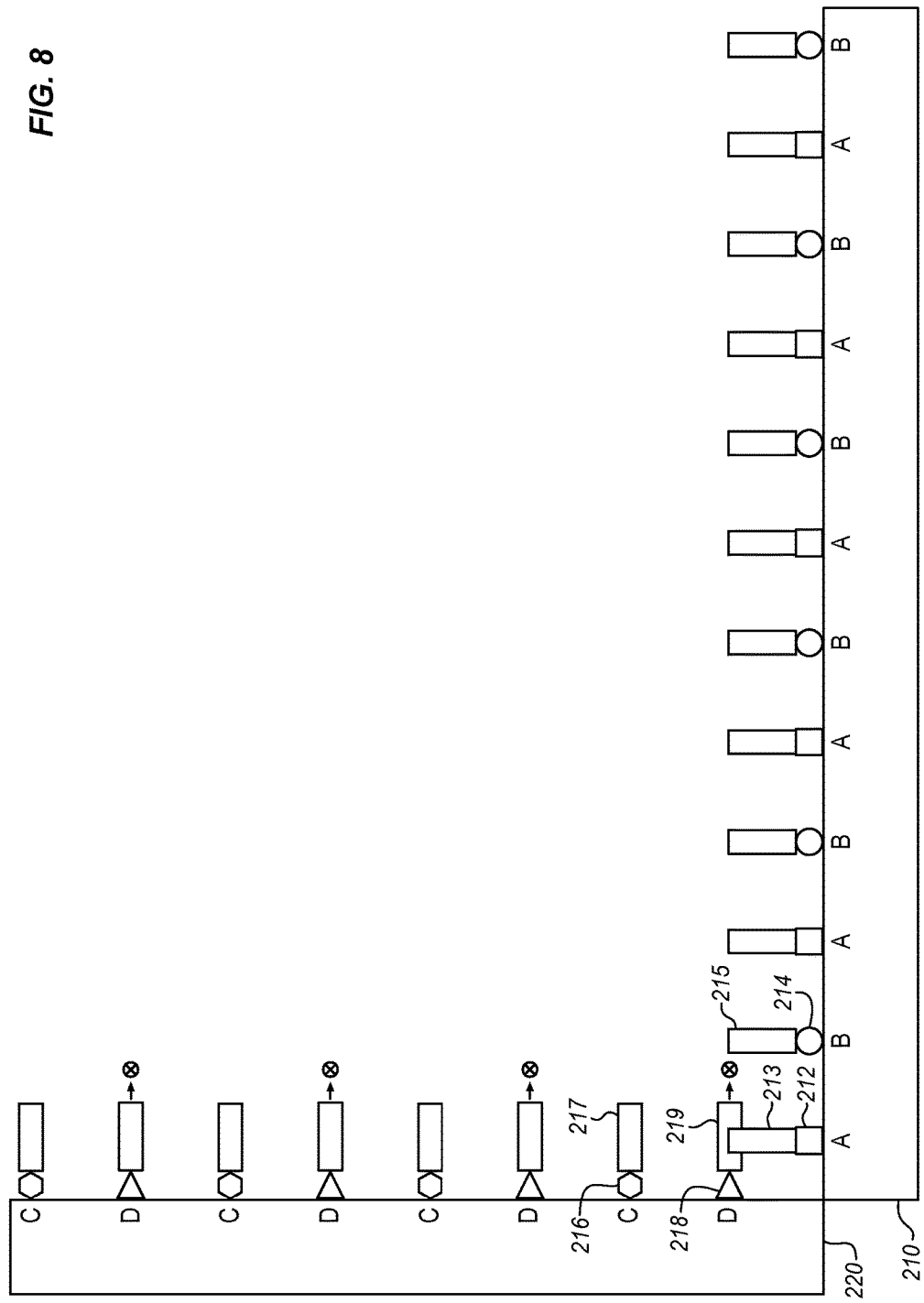
Figure 9:
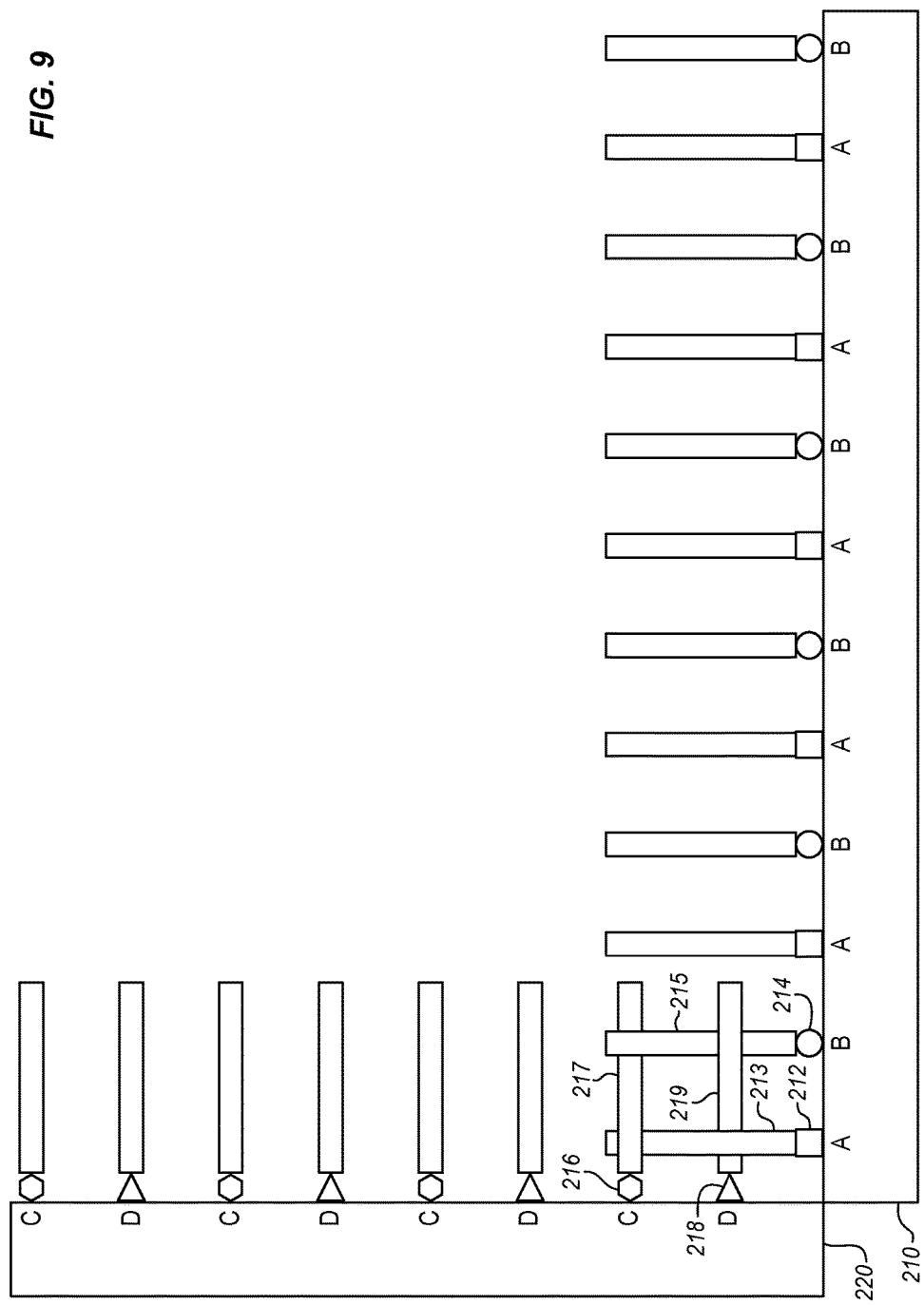

Controller 230 may continue to trigger growth for different sets of carbon nanotubes, and change their direction of growth, in order to trigger interweaving of the different sets of carbon nanotubes (step 310, returning to step 302). For example, as shown in FIG. 6, carbon nanotubes 215 (having chirality B) are grown from catalysts 214 upward and into the page away from the reader. Then carbon nanotubes 217 (having chirality C) are grown from catalysts 216 rightward and out of the page towards the reader as shown in FIG. 7, and carbon nanotubes 219 (having chirality D) are grown from catalysts 218 upward and out of the page towards the reader as shown in FIG. 8. Growth continues in this fashion in FIGS. 9 and 10, but the vertical component of growth for each set of nanotubes is periodically reversed/inverted/altered (e.g., in an oscillating fashion). This may be achieved by sweeping the electrical field back and forth through a repeating range of alignments. This results in sheet 1000 exhibiting woven properties (because the nanotubes grow alternately upward and downward around each other as their growth continues).

Figure 10:
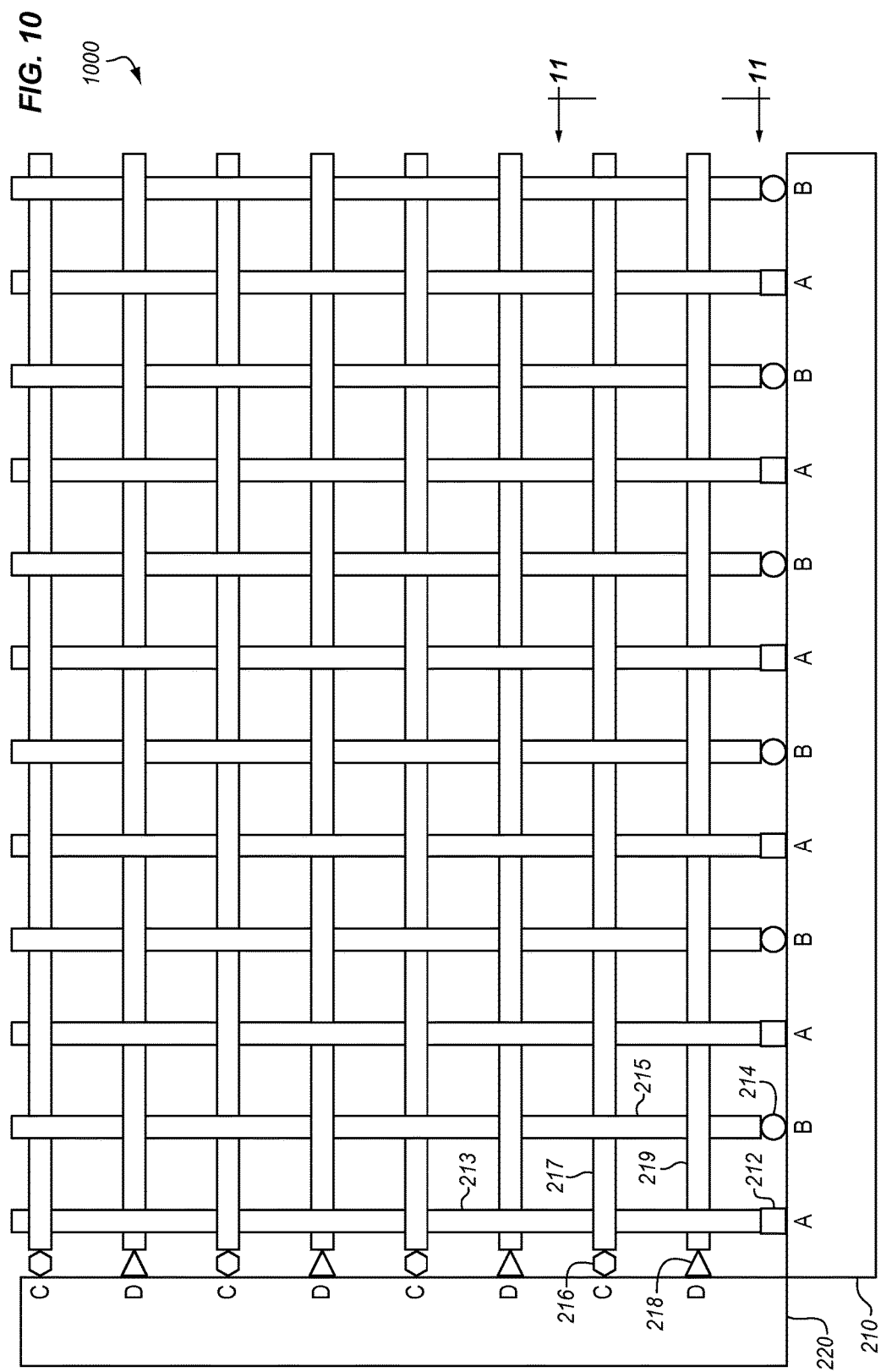
Figure 11:
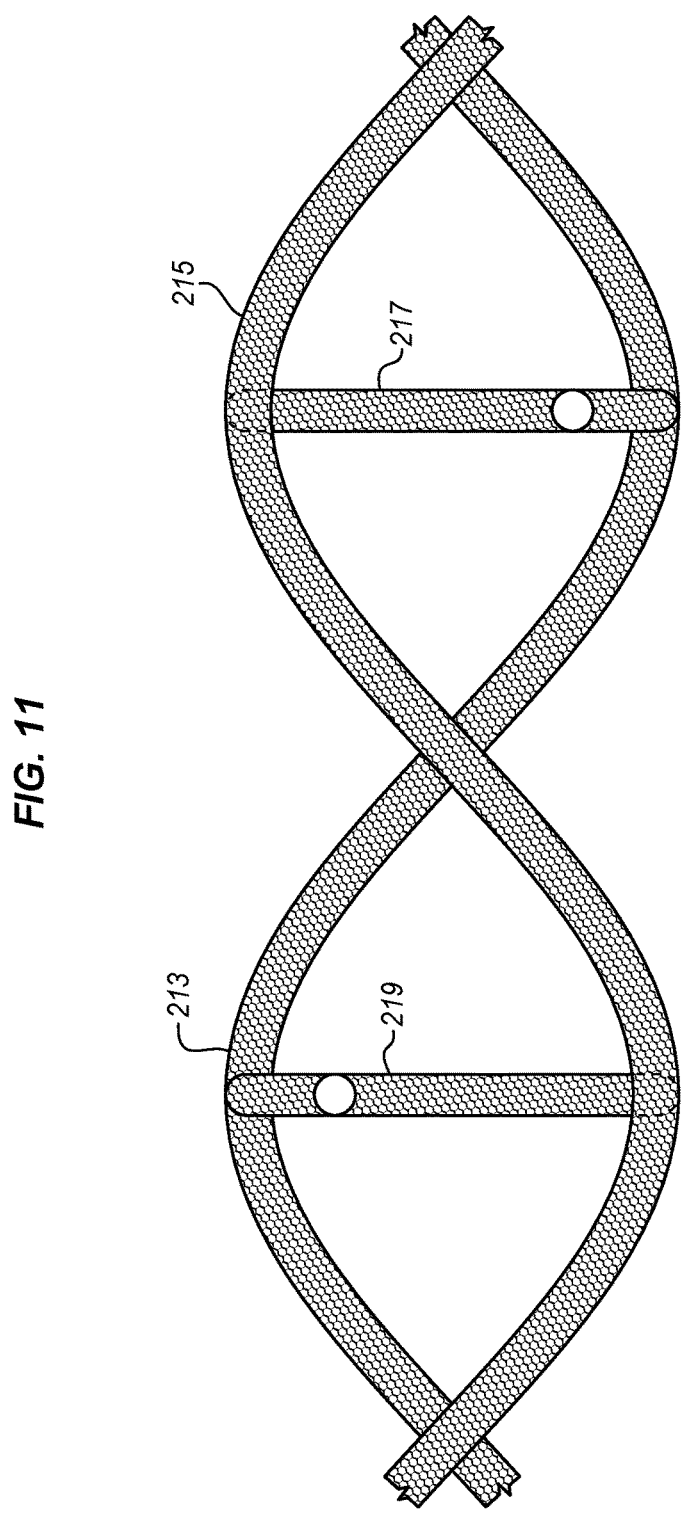
FIG. 11 is a diagram illustrating sinusoids formed by carbon nanotubes in an exemplary embodiment.

FIG. 11 is a side view of a portion of sheet 1000 shown in FIG. 10. Specifically, FIG. 11 is illustrated by view arrows 11 of FIG. 10. In FIG. 11, the lattice structure of individual carbon nanotubes is shown merely for the purpose of illustration and is not to scale. FIG. 11 illustrates that carbon nanotubes 213 and 215 may be grown to form sinusoids that have the same amplitude and continue in the same direction, but are offset/shifted in phase from each other such that when carbon nanotube 213 reaches a peak, carbon nanotube 215 reaches a valley. Carbon nanotubes 217 and 219 also form sinusoids that are offset in phase, and travel in a direction that will cause them to interweave with nanotubes 213 and 215. In one embodiment, catalysts for carbon nanotubes that are placed on the same substrate are separated from each other by a distance of several millimeters. The carbon nanotubes in this embodiment may also oscillate upward and downward during growth by an amplitude of several millimeters. That is, the amplitude of the sinusoids shown in FIG. 11 may be several millimeters. While sinusoidal shapes are illustrated in FIG. 11, the techniques described herein are by no means limited to sinusoidal patterns nor to the length scales indicated.

Figure 12:
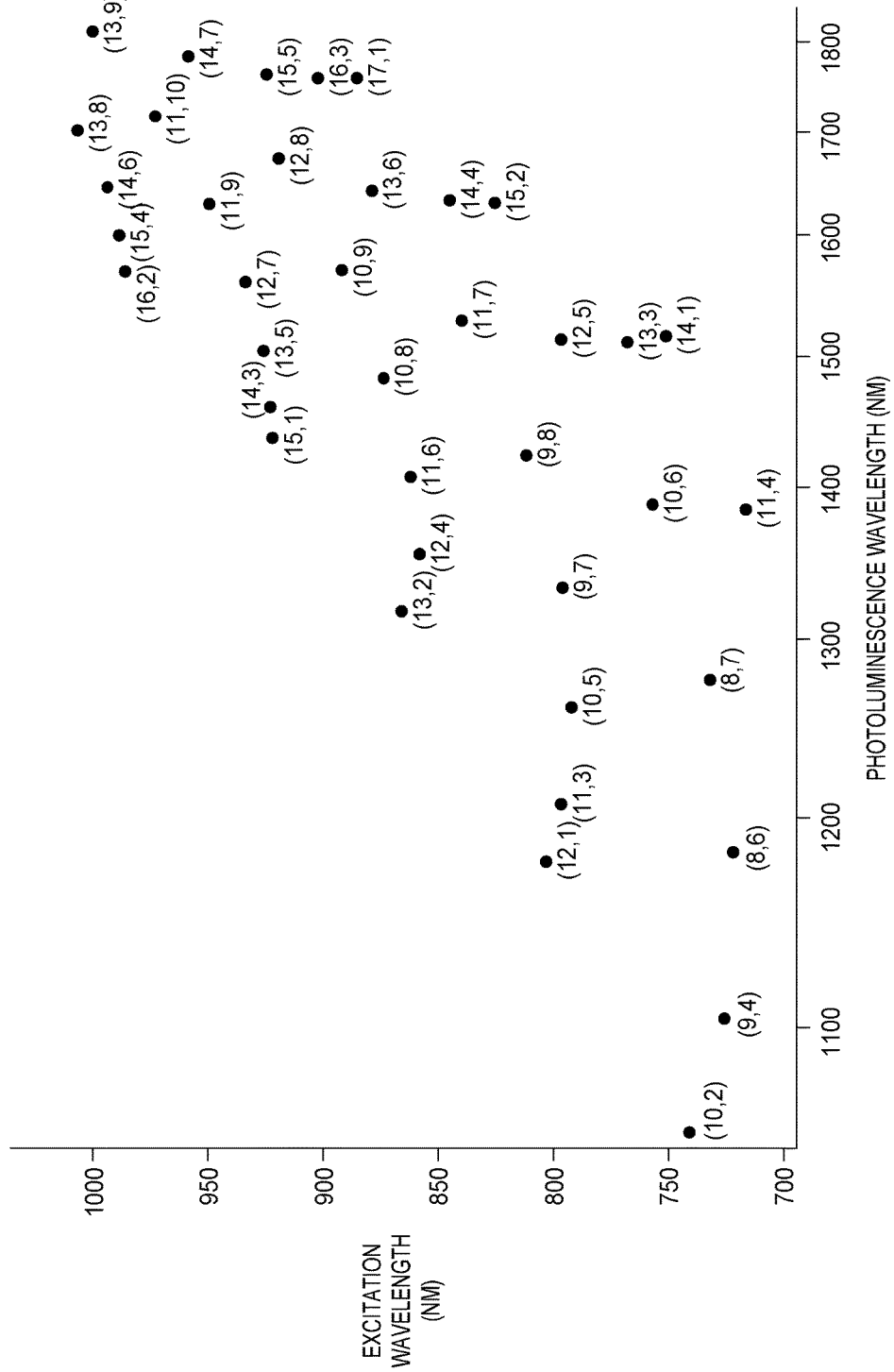
FIG. 12 is a diagram illustrating excitation wavelengths and photoluminescence wavelengths for different chiralities of carbon nanotubes in an exemplary embodiment.
Figure 13:
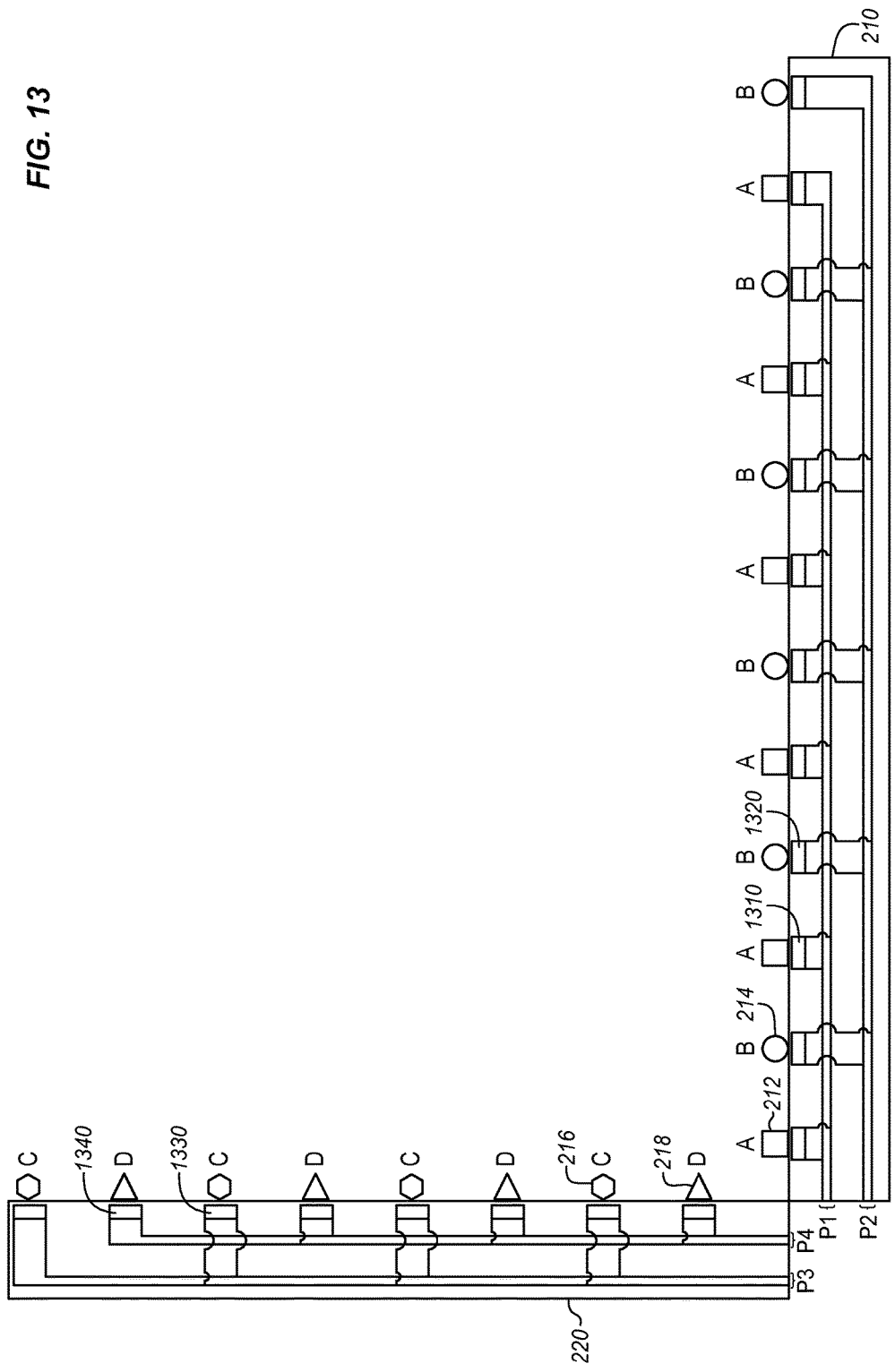
FIG. 13 is a diagram illustrating substrates that utilize heaters in an exemplary embodiment.

FIGS. 12-13 illustrate concepts and systems relating to selectively heating different sets and/or chiralities of nanotubes to facilitate the growth processes described above. Specifically, FIG. 12 is a diagram illustrating excitation wavelengths/frequencies and photoluminescence wavelengths/frequencies for different chiralities of carbon nanotubes in an exemplary embodiment. This information may be utilized to operate lighting system 232 of FIG. 2 to selectively heat (and thereby trigger the growth of) different chiralities of carbon nanotubes. Specifically, by emitting light at both the photoluminescence wavelength/frequency and the excitation wavelength/frequency of a specific chirality of nanotube, that chirality of nanotube may experience substantially more heating than other chiralities. Thus, by selectively operating lighting system 232 to apply multiple wavelengths of light at specific frequencies at the same time, controller 230 may selectively heat catalysts within fabrication system 200 to a temperature that triggers growth.

FIG. 13 is a diagram illustrating substrates that utilize heaters (1310, 1320, 1330, 1340) to heat carbon nanotubes in an exemplary embodiment. In this embodiment, different chiralities of carbon nanotubes need not be used. Instead, the heaters may be selectively activated by controller 230 to trigger the growth of different sets of carbon nanotubes. These heaters (1310, 1320, 1330, 1340) may be integrated into substrates (e.g., 210, 220) upon which the catalysts (e.g., 212, 214, 216, 218) are arranged. For example, as shown in FIG. 13, heaters 1310 (for catalysts 212) are electrically coupled to activate by applying a differential voltage to wires P1, while heaters 1320 (for catalysts 214) are electrically coupled to activate by applying a differential voltage to wires P2. In a similar fashion, heaters 1330 (for catalysts 216) are electrically coupled to activate by applying a differential voltage to wires P3, while heaters 1340 (for catalysts 218) are electrically coupled to activate by applying a differential voltage to wires P4.

The techniques described herein may also be applied in systems that allow for multiple layers of woven carbon nanotubes to be created at once. For example, FIGS. 14-15 are diagrams illustrating a substrate 1410 capable of growing multiple layers of carbon nanotubes at once in an exemplary embodiment. In FIG. 14, a top view is shown of substrate 1410. FIG. 15 illustrates a front view of substrate 1410 indicated by view arrows 15. As shown in FIG. 15, carbon nanotubes are grown from alternating locations A and B, in each of multiple layers 1510, 1520, and 1530. In this manner, fabrication may be performed efficiently as heating and electric fields may be applied to facilitate the growth of carbon nanotubes in multiple layers at once.

FIGS. 16-17 are diagrams illustrating motion of an electric field generator 1610 about substrates for growing carbon nanotubes in an exemplary embodiment. Specifically, FIG. 16 is a zoomed out view of FIG. 5, wherein substrates 210 and 220 are surrounded by a chassis, 1690 and FIG. 17 is a front view indicated by view arrows 17 of FIG. 16. According to FIGS. 16-17, multiple electric field generators 1610 are placed on a rocking chassis 1690. Generators 1610 are attached to chassis 1690 via support elements 1640. Chassis 1690 rotates about axis 1650 in an oscillating fashion as growth occurs, causing electric field 1620 to change its orientation. As electric field 1620 changes orientation (e.g., by plus or minus five degrees of rotation about axis 1650), carbon nanotubes grown at substrate 220 change their orientation as they extend outward, resulting in the formation of sinusoidal carbon nanotubes. Similar mechanisms and systems may be utilized to generate varying electric fields that facilitate the growth of carbon nanotubes at substrate 210.

The rotation of chassis 1690 may be driven by any suitable mechanism, including form example linear actuator 1670, attached to a support element 1640 via a securement point 1660.

Stitching Sheets of Nanotubes Together

The size of an interwoven sheet of carbon nanotubes may be limited by the size of a CVD growth chamber in which it is grown. CVD growth chambers may be substantially small (e.g., less than four inches by four inches across), meaning that the size of individually grown sheets may be limited on the macro scale. In order to ensure that sheets of carbon nanotubes may be utilized in a variety of scenarios and for parts larger than a few inches across, FIGS. 18-29 illustrate how a new substrate may be used to stitch individual sheets of carbon nanotubes together. In this manner, larger weaves of carbon nanotubes may be fabricated, without having to increase the size of a CVD growth chamber in which individual sheets are grown.

Figure 18:
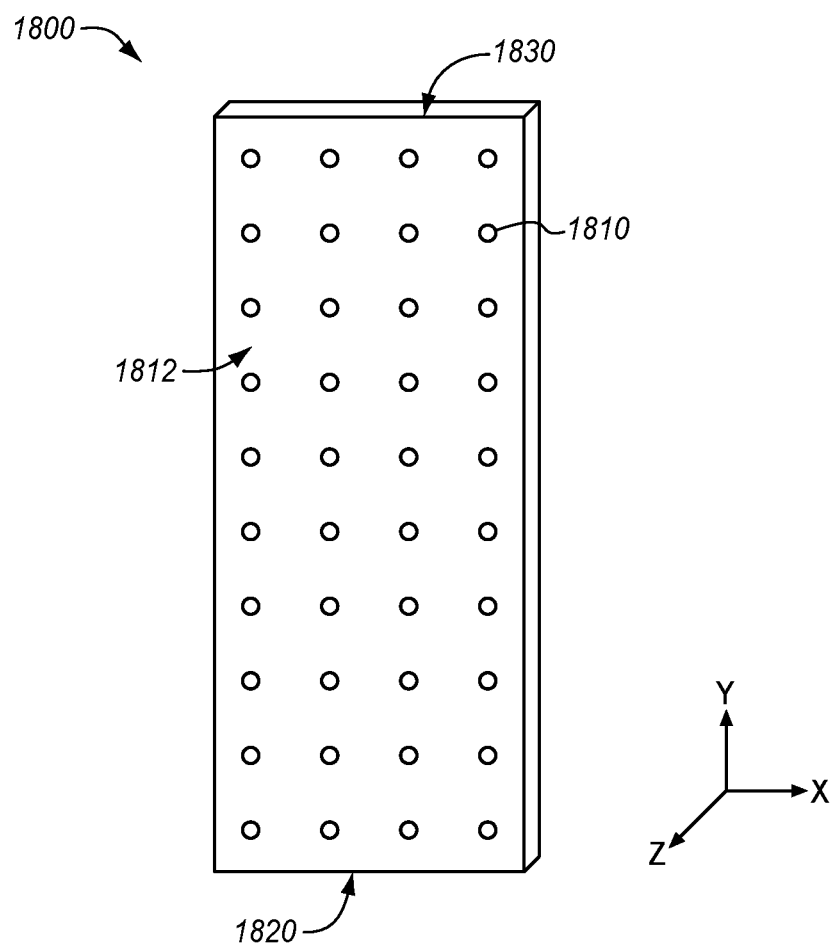
FIG. 18 is a diagram illustrating a substrate for stitching together multiple sheets of interwoven carbon nanotubes in an exemplary embodiment.

FIG. 18 is a diagram illustrating a substrate 1800 for stitching together multiple sheets of interwoven carbon nanotubes in an exemplary embodiment. Substrate 1800 includes multiple catalysts 1810. Each catalyst 1810 may grow the same chirality of nanotube. In this manner, nanotubes may be grown from all of catalysts 1810 at once. Catalysts 1810 are located on surface 1812 of substrate 1800. In this embodiment, catalysts 1810 run along a length of substrate 1800 from a top end 1830 to a bottom end 1820. Substrate 1800 may be placed underneath sheets of interwoven carbon nanotubes, and new carbon nanotubes may be grown from substrate 1800 in order to stitch those sheets together. Further details of the arrangement of substrate 1800 with regard to sheets of carbon nanotubes are illustrated with regard to FIGS. 19-20.

Figure 19:
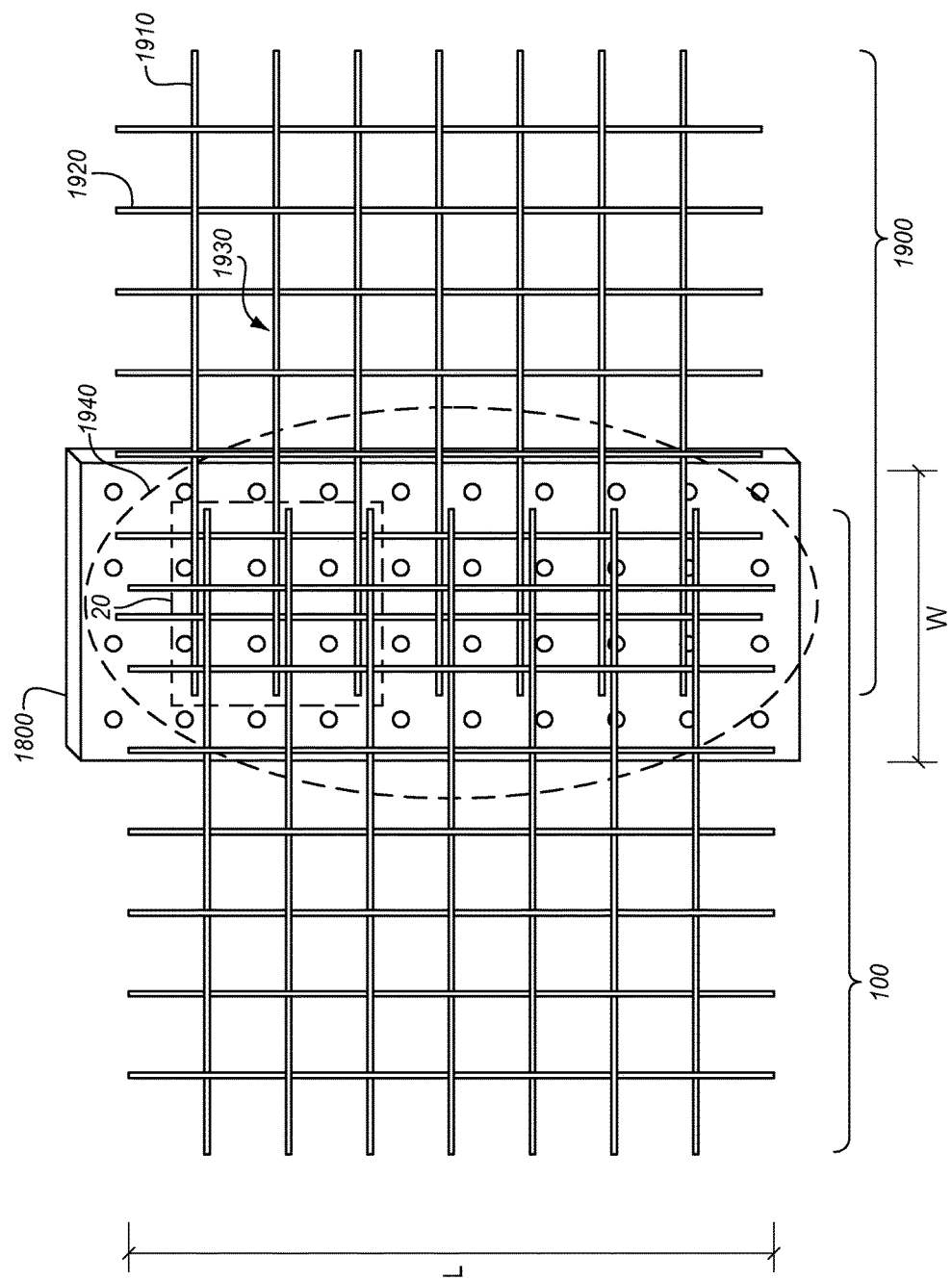
FIG. 19 is a diagram illustrating sheets of interwoven carbon nanotubes arranged over a substrate in an exemplary embodiment.

FIG. 19 is a diagram illustrating sheets of interwoven carbon nanotubes arranged over a substrate in an exemplary embodiment. Specifically, FIG. 19 illustrates a view of substrate 1800, as well as sheets 100 and 1900 of interwoven carbon nanotubes. Sheets 100 and 1900 overlap in a stitching region 1940 over substrate 1800. As shown in FIG. 19, sheet 1900 includes vertically oriented nanotubes 1920, and horizontally oriented nanotubes 1910. Nanotubes 1910 and 1920 together define interstices 1930. Sheets 100 and 1900 are arranged so that their interstices 130 and 1930 overlap in stitching region 1940 having a width W. This overlap ensures that nanotubes grown from substrate 1800 may stitch sheets 100 and 1900 together with adequate strength. Stitching region 1940 extends from a first end (e.g., top end 1830) to a second end (e.g., bottom end 1840).

Figure 20:
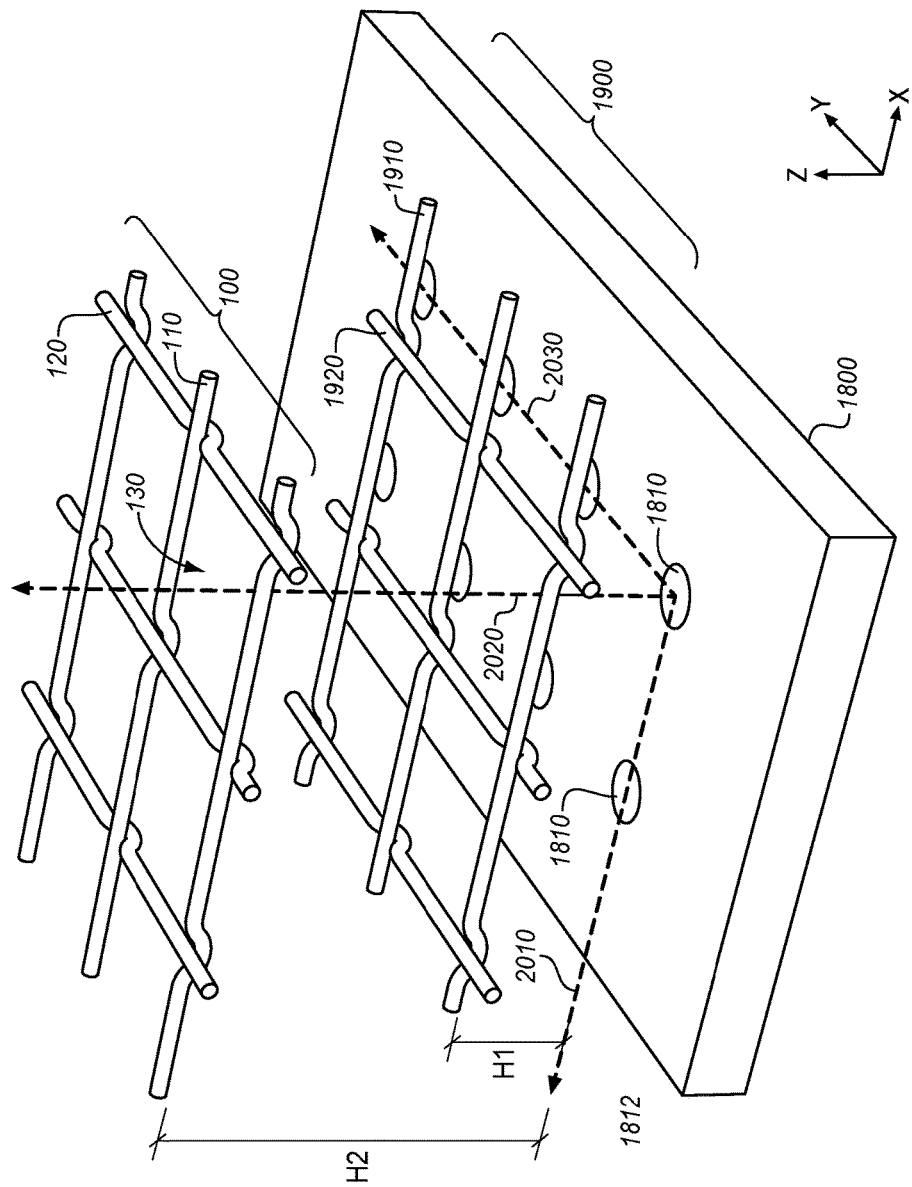
FIG. 20 is a perspective view illustrating the arrangement of the sheets of FIG. 19 in an exemplary embodiment.

FIG. 20 is a perspective view illustrating the arrangement of the sheets of FIG. 19 in an exemplary embodiment. Specifically, FIG. 20 illustrates a perspective view of region 20 of FIG. 19, which is within stitching region 1940. As shown in FIG. 20, sheet 1900 and sheet 100 are arranged substantially horizontally (e.g., they are parallel with the XY plane). Sheets 1900 and 100 are placed heights H1 and H2, respectively, above substrate 1800. In one embodiment, sheets 1900 and 100 are laid directly atop each other. In a further embodiment, sheets 1900 and 100 are each braced/held in place by a brace or other structure as they are arranged over substrate 1800. While sheets 100 and 1900 are arranged horizontally in this embodiment, in alternative embodiments sheets 100 and 1900 may be arranged at an angle with respect to each other, or may even comprise curved sheets for stitching together. FIG. 20 further illustrates that, from a given catalyst 1810, a nanotube may grow vertically along direction 2020, (e.g., through interstices at both sheet 1900 and sheet 100), may proceed along in direction 2010 along the X axis, or may proceed in direction 2030 along the Y axis. The separation distance between catalysts 1810 need not correspond exactly with the separation distance between interstices at sheet 1900 or sheet 100. If catalysts 1810 are more closely spaced than interstices 130 and/or 1930, then multiple nanotubes may grow up from catalysts 1810 to penetrate through the same interstice. In contrast, if catalysts 1810 are spaced further apart than interstices 130 and 1930, then some interstices will not have carbon nanotubes grown through them. Similarly, catalysts 1810 need not be arranged in the same pattern as the interstices of sheets 100 and 1900. For example, interstices 130 at sheet 100 may be arranged in a hexagonal tessellating pattern, while catalysts 1810 may be arranged in a square grid if desired. Similarly, interstices 130 and 1930 need not be identical in size or shape.

In any case, precise registration (i.e., alignment) of individual catalysts 1810 with individual interstices 1930 and 130 is not required. Furthermore, the strength of stitching holding together sheets 1900 and 100 may be adjusted by adjusting the number and spacing of catalysts 1810 in stitching region 1940. This allows for the mechanical properties of the resulting stitched sheet to be controlled. In further embodiments, any number of stacked sheets may be stitched together via the growth of carbon nanotubes from catalysts 1810.

Figure 21:
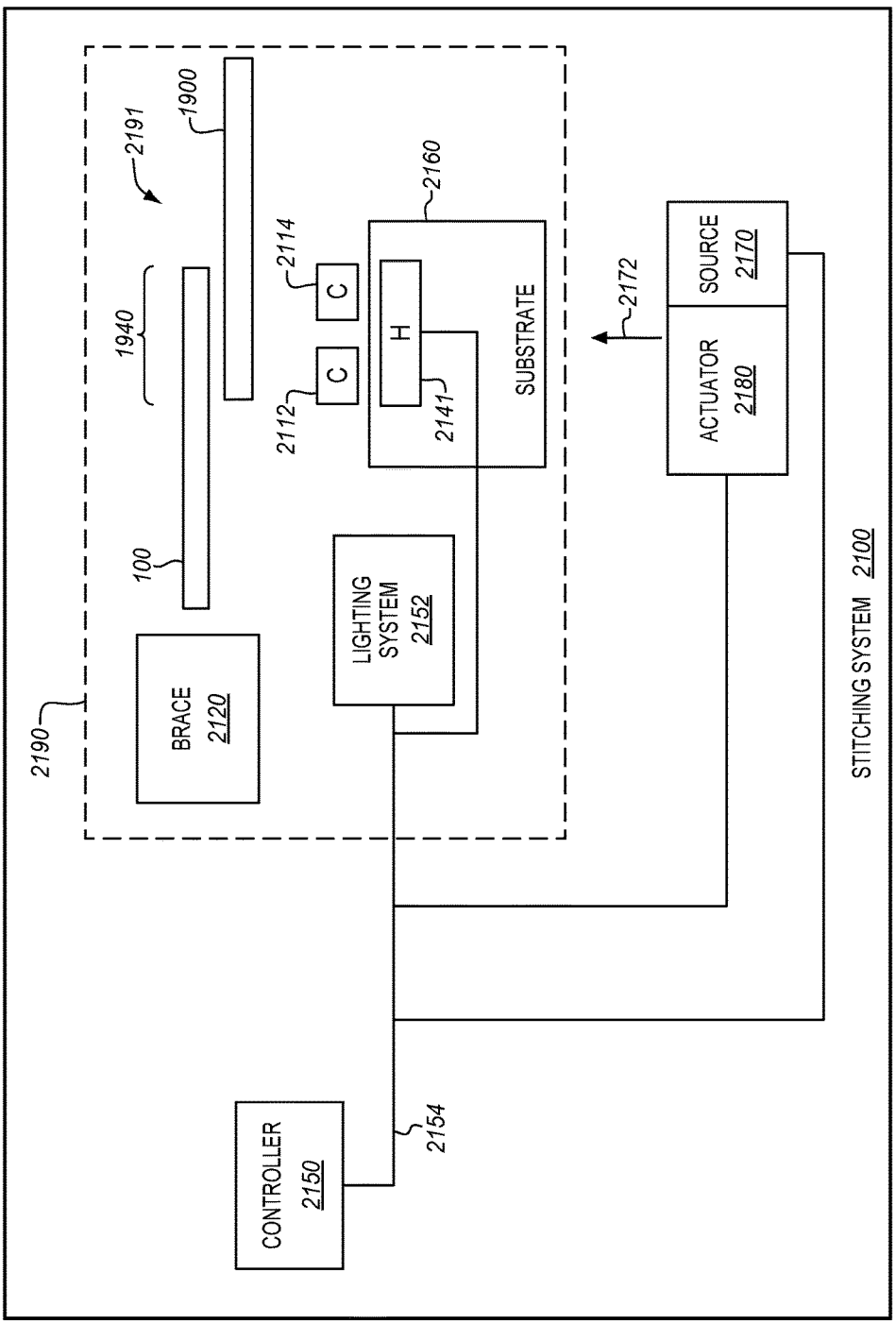
FIG. 21 is a block diagram illustrating a system for stitching sheets of interwoven carbon nanotubes together in an exemplary embodiment.

FIG. 21 is a block diagram illustrating a stitching system 2100 for stitching sheets of interwoven carbon nanotubes together in an exemplary embodiment. Stitching system 2100 comprises any system capable of binding sheets of carbon nanotubes together by growing nanotubes (e.g., via Chemical Vapor Deposition (CVD) processes) which thread through interstices in the sheets. Stitching system 2100 may vary from system 200 in that system 2100 may include one or more braces 2120 for holding sheets 100 and/or 1900 in place, and substrate 2160 need not include multiple different types of catalysts. In this embodiment, system 2100 includes CVD chamber 2190, in which substrate 2160 is placed. Substrate 2160 includes catalysts 2112 and 2114, which may be used to grow the same or different chiralities of nanotubes.

Stitching system 2100 also includes components that trigger and direct growth from each of the catalysts 2112 and 2114. That is, controller 2150 may operate heating device 2141 (e.g., an electrically resistive heater) order to heat catalysts 2112 and 2114 to a threshold temperature that triggers CVD processes and growth of new carbon nanotubes from catalysts 1810 of substrate 1800. Alternatively or additionally, controller 2150 may operate lighting system 2152 to apply light at wavelengths that energize and heat certain catalysts above a threshold temperature. In this embodiment, controller 2150 is coupled via communication channel 2154 to lighting system 2152, heating device 2141, actuator 2180, and electric field source 2170. Controller 2150 may be implemented, for example, as custom circuitry, as a processor executing programmed instructions, or some combination thereof.

As controller 2150 triggers the growth of nanotubes from catalysts 2112 and 2114, controller 2150 may operate an electric field source 2170 in order to generate an electrical field 2172 defining a direction of growth for new carbon nanotubes from substrate 1800. Sheets 100 and 1900, as well as substrate 1800, are placed within CVD chamber 2190 (also referred to as a "CVD furnace"). As carbon nanotube growth occurs within interior 2191 of CVD chamber 2190 to form sheet 100, the carbon nanotubes will grow parallel to the applied electrical field. Controller 2150 may further operate actuator 2180 in order change the direction of/re-orient the electrical field 2172 as growth continues (e.g., simultaneously with the growth of the carbon nanotubes, or in between growth phases before the carbon nanotubes have finished growing to their intended length). This may ensure that nanotubes grown from substrate 2160 grow in desired directions at desired points in time.

Electric field 2172 is in fact a vector field, meaning that its strength and direction are both a function of position. Accepting this, the field direction and magnitude set by controller 2150 are desired to be present at the ends of each nanotube being grown. While the change in the location of the end with time is small on a macroscopic scale, the change the impact of its local environment (e.g., the surrounding substrate) on the electric field may not be negligible. It is, however, predictable, by finite element modeling (e.g., in a program such as FEKO by Altair) of static electric fields in the presence of substrate 1800 and any growing nanotube at their current stage of growth. Such an analysis inherently includes any dielectric polarization or other near field effects of the substrates and the growing nanotube. This analysis will generate a convolution function where by the user can determine how electric field 2172 will be experienced locally at each nanotube end at a certain time (or stage of growth). The altering direction of electric field 2172 over time may then be fed into controller 2150. This sequence of steps ensures that nanotubes will be grown in a desired conformation.

By controlling the direction of growth of nanotubes from substrate 2160 via electric field source 2170, controller 230 may stitch sheets 100 and 1900 together in to an integral sheet. This allows for scaling the size of sheets of carbon nanotubes, allowing their use in larger structural components.

Figure 22:
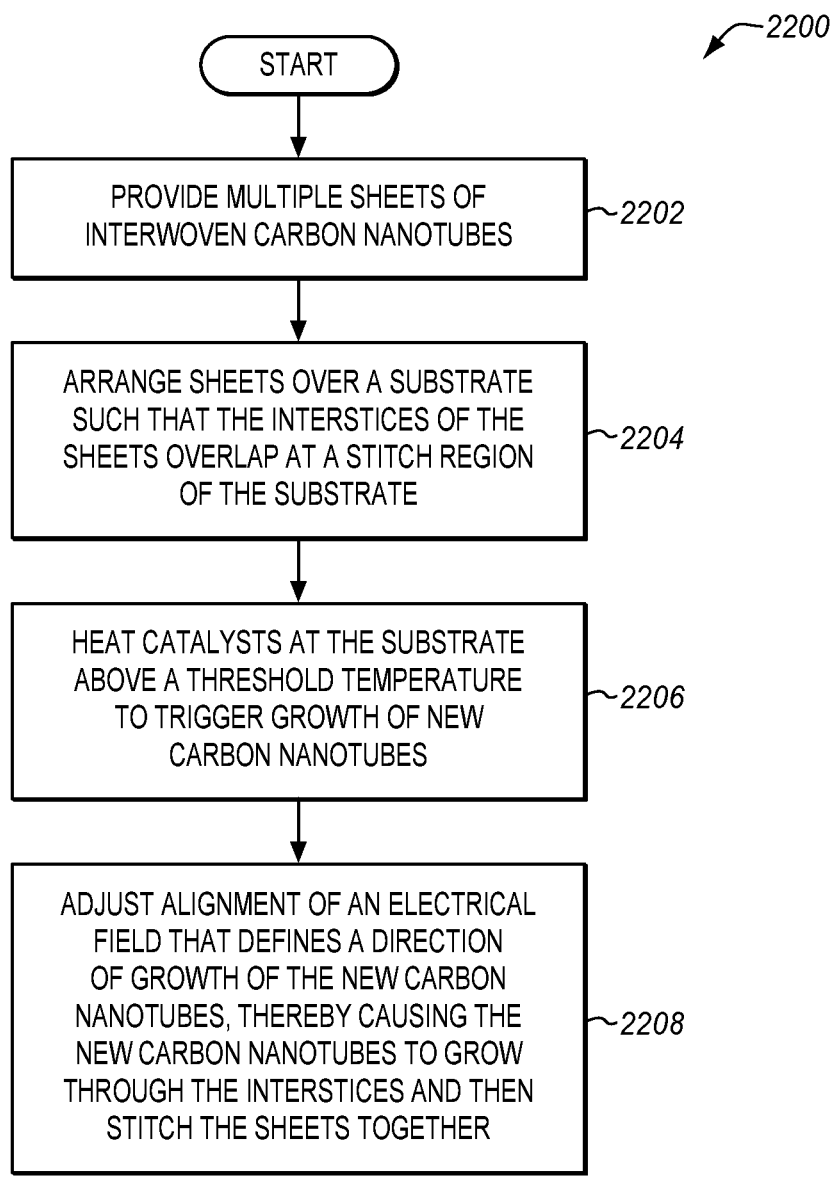
FIG. 22 is a flowchart illustrating a method for stitching sheets of carbon nanotubes together in an exemplary embodiment.

FIG. 22 is a flowchart illustrating a method 2200 for stitching sheets of carbon nanotubes together in an exemplary embodiment. Method 2200 includes providing multiple sheets of interwoven carbon nanotubes (step 2202). For example this may comprise acquiring two sheets of carbon nanotubes, ten sheets of carbon nanotubes, etc. Method 2200 further includes arranging the sheets over substrate 1800 such that interstices (e.g., 130, 1930) of the sheets overlap at a stitch region 1940 of substrate 1800 (step 2204). This arrangement may be performed by laying sheets 100 and 1900 flat over each other, or may include more exotic arrangements such as curving sheets 100 and 1900 into arcs over substrate 1800, arranging sheets 100 and 1900 skewed or angled with respect to each other, etc.

Method 2200 continues as controller 2150 activates heating device 2141 (e.g., a heater integral with, or independent from substrate 2160) in order to increase the temperature of catalysts 2112 and 2114 at substrate 2160 above a threshold temperature to trigger growth of new carbon nanotubes via CVD (step 2206). Controller 2150 further operates actuator 2180 to adjust the alignment of electrical field 2172 (step 2208). Electrical field 2172 defines a direction of growth of new carbon nanotubes from substrate 1800, thereby causing the new carbon nanotubes to grow through the interstices 130 and 1930 of sheets 100 and 1900, respectively. By changing the direction of field 2172, controller 2150 may stitch sheets 100 and 1900 together.

Figure 23:
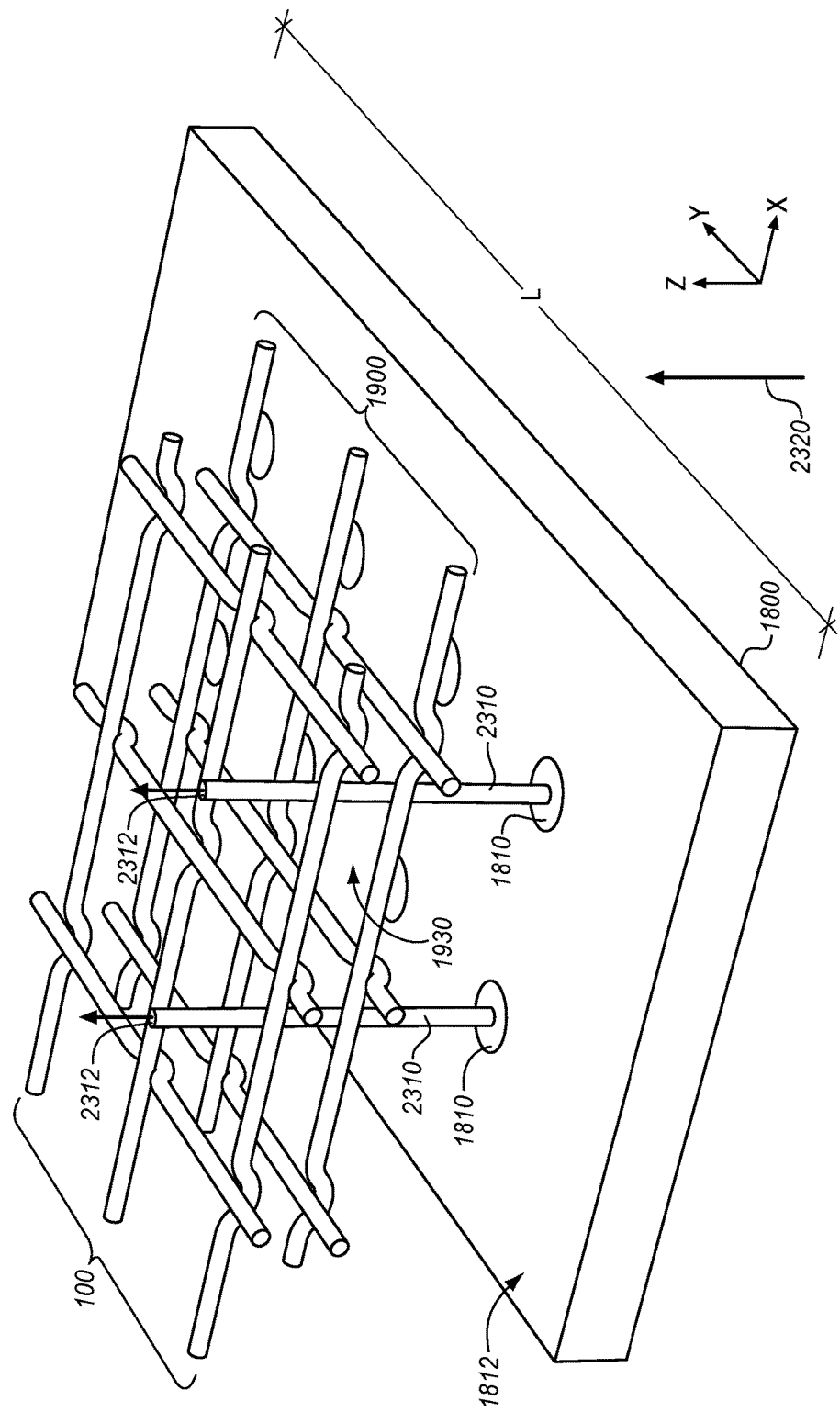
FIGS. 23-28 are a diagrams illustrating growth of nanotubes in a manner that stitches together sheets of nanotubes in an exemplary embodiment.
Figure 24:
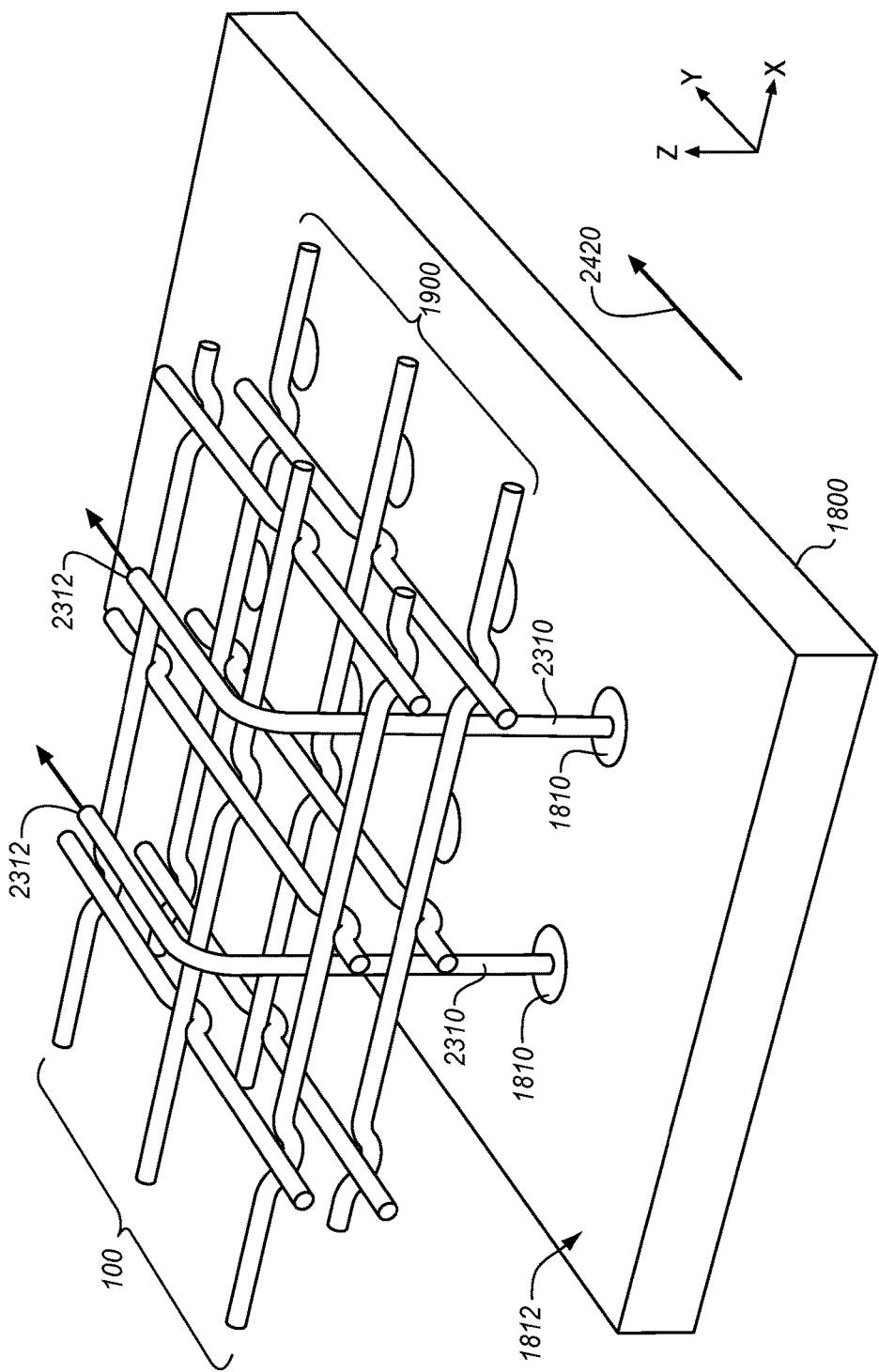

FIGS. 23-28 are a diagrams illustrating growth of nanotubes in a manner that stitches together sheets of nanotubes in an exemplary embodiment. Specifically, FIG. 23 illustrates a scenario wherein nanotubes 2310 (also referred to as "new carbon nanotubes" 2310) are grown from catalysts 1810 such that ends 2312 of nanotubes 2310 grow in direction 2320. By growing in a first vertical direction 2320, nanotubes 2310 penetrate through interstices 130 and 1930 of sheets 100 and 1900. Although only two nanotubes 2310 are illustrated as being grown in FIG. 23 for the sake of clarity, nanotubes 2310 may be grown from each catalyst 1810 on substrate 1800, forming a grid of carbon nanotubes 2310 which grow together in alignment with electric field 2172.

Figure 25:
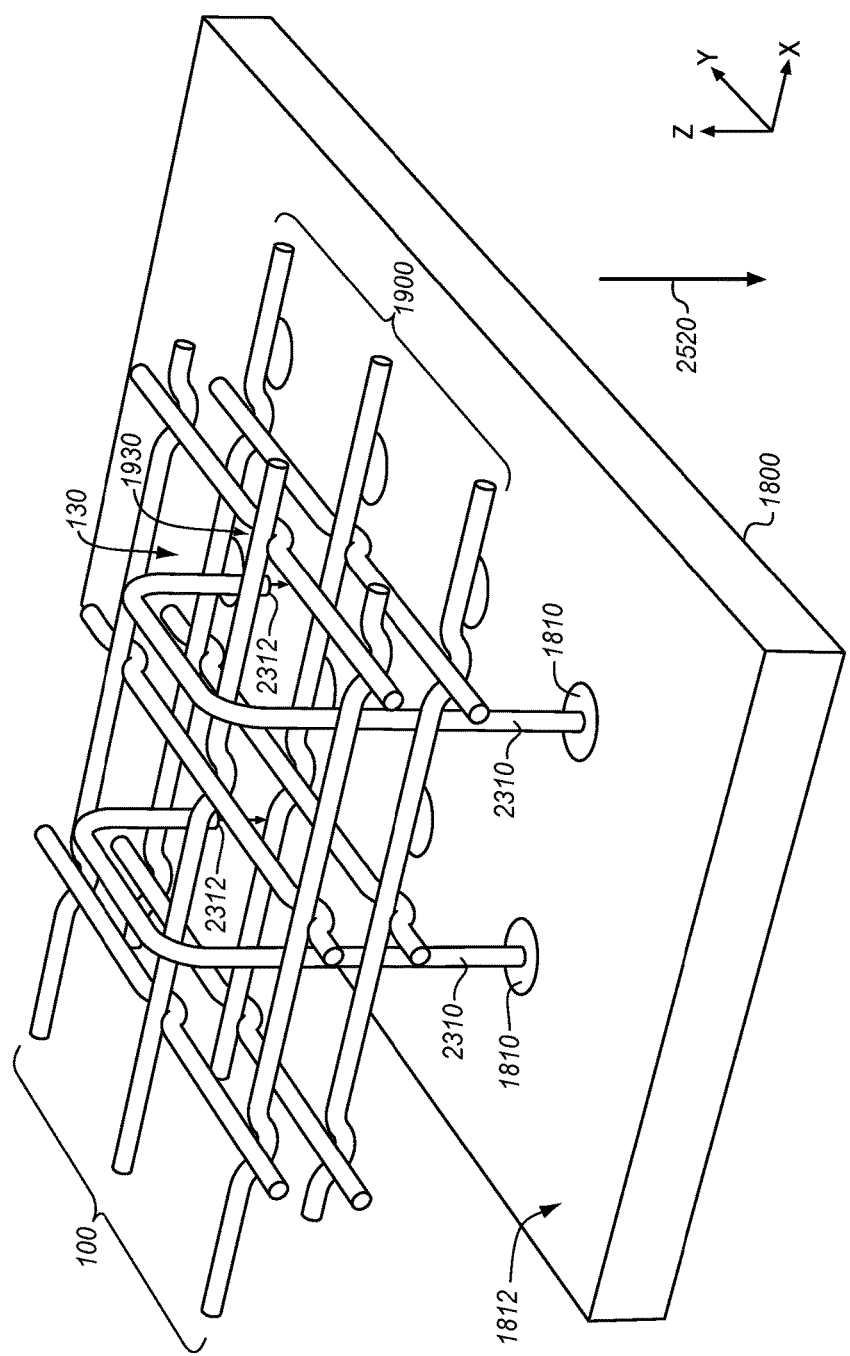
Figure 26:
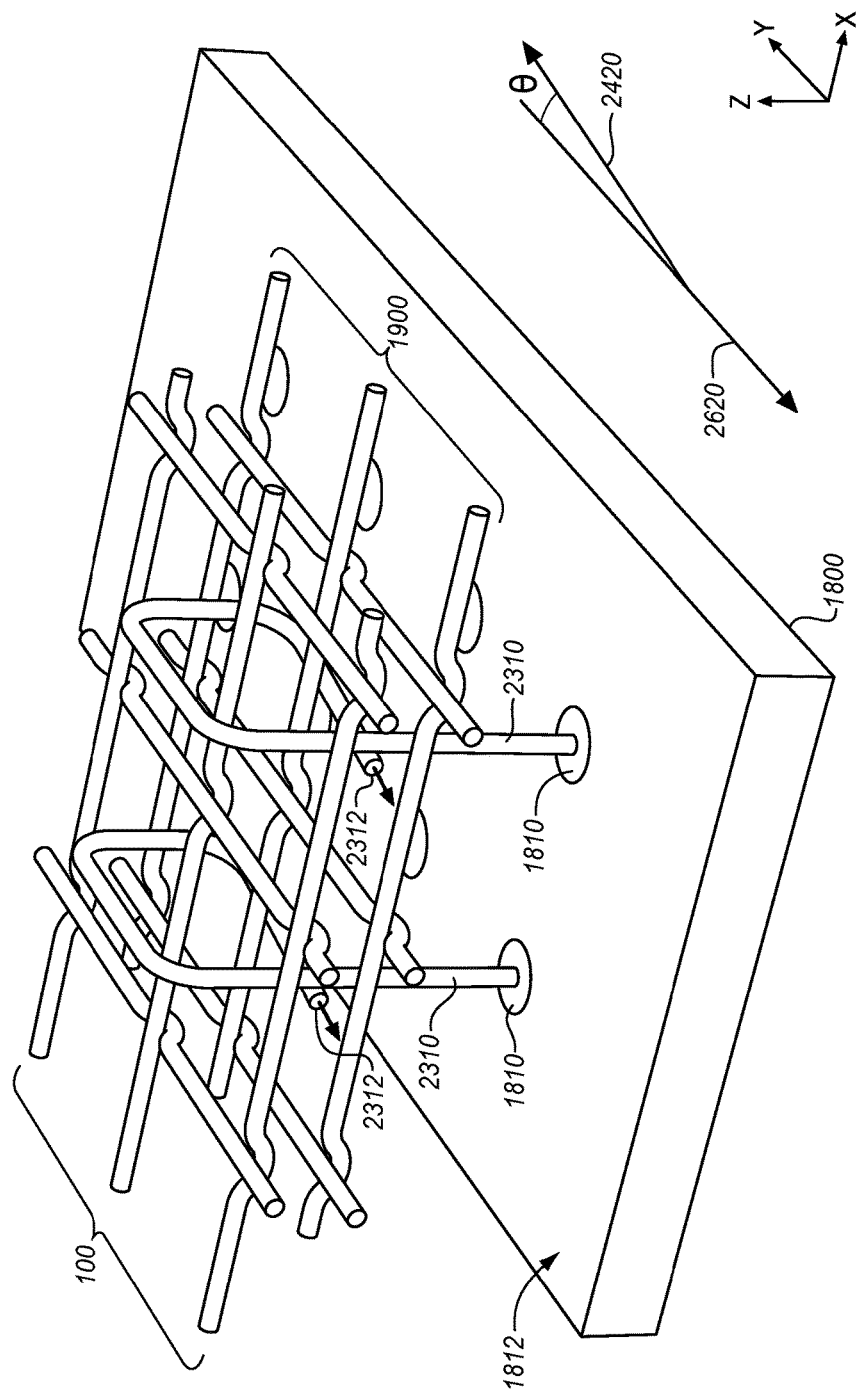

After nanotubes 2310 have penetrated interstices 130 and 1930, controller 2150 selects a new direction 2420 (i.e., a first lateral direction) of growth, and aligns electric field 2172 with direction 2420. This causes nanotubes 2310 to grow in direction 2420. Controller 2150 may then wait for nanotubes 2310 to grow at least an interstitial distance (e.g., DX, DY) after aligning electric field 2172 in direction 2420. In this manner, controller 2150 continues to grow nanotubes 2310 in direction 2420 until ends 2312 of nanotubes 2310 extend beyond the boundaries of the interstices which they penetrated. Next, as shown in FIG. 25, nanotubes 2310 may be grown in a second vertical direction 2520 such that their ends 2312 grow downward through another set of interstices 130 and 1930. During this process, growth may be controlled to ensure that ends 2312 of nanotubes 2310 do not contact catalysts 1810.

Figure 27:
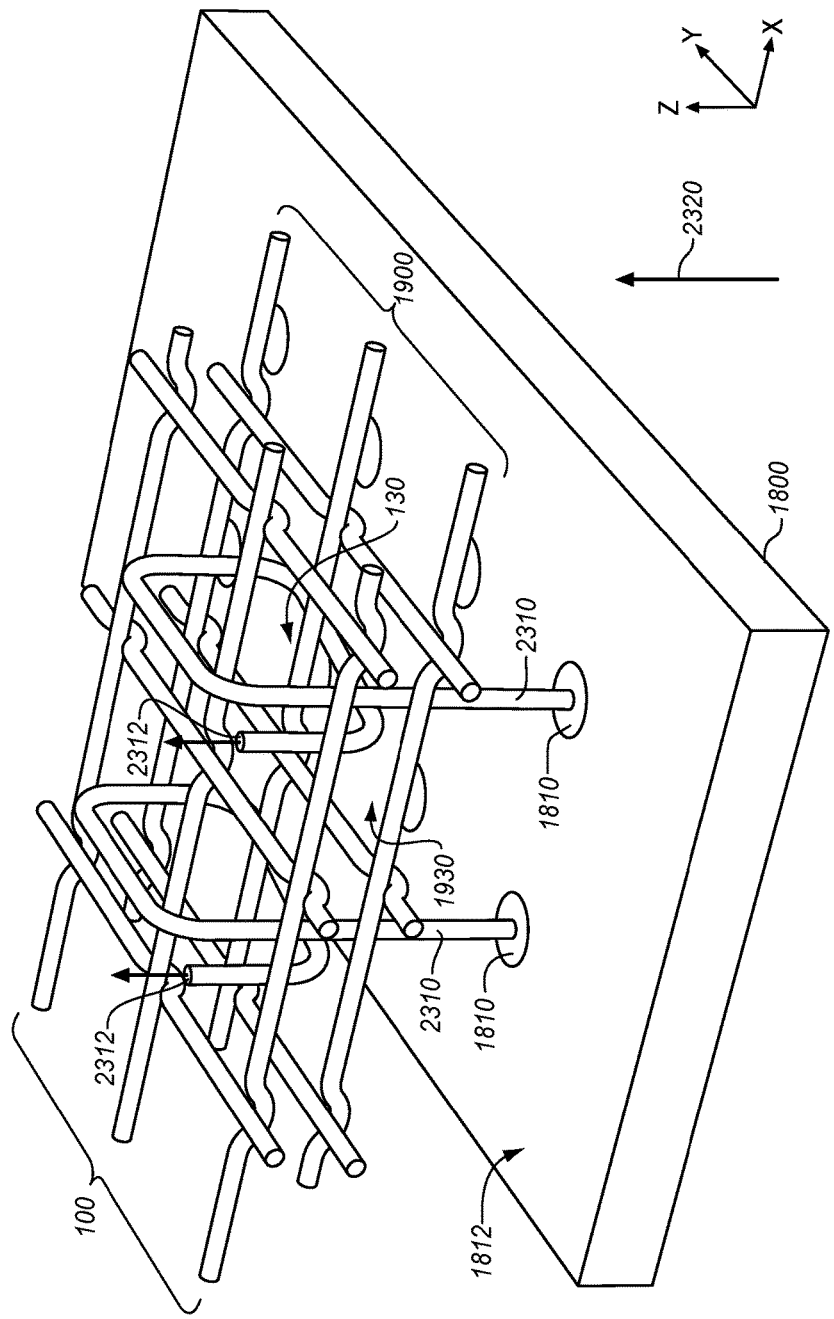
Figure 28:
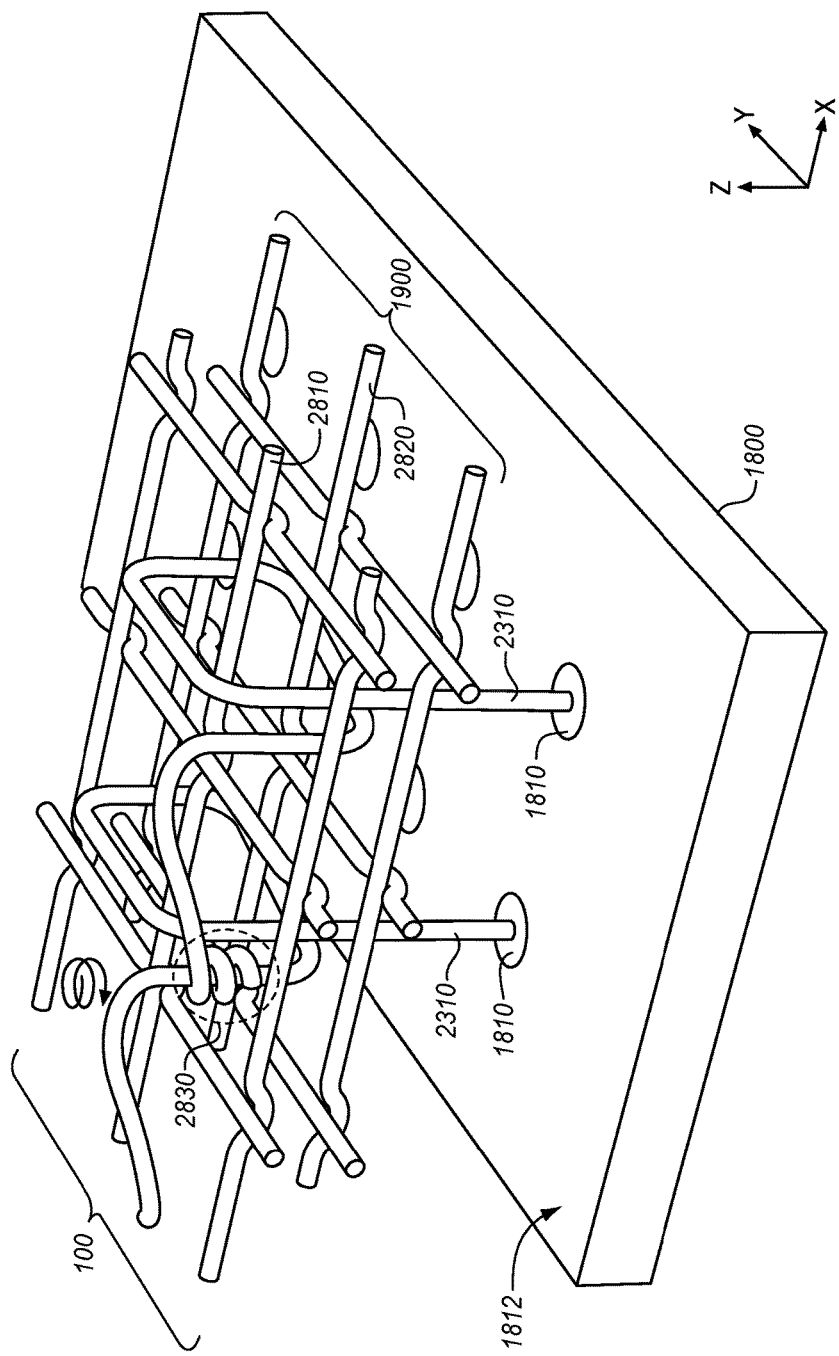

With nanotubes 2310 grown back through another set of interstices, controller 2150 aligns electric field 2172 in a second lateral direction 2620. In one embodiment, direction 2620 is not parallel with direction 2420, nor does direction 2620 otherwise proceed directly in line with direction 2420. Instead, direction 2620 is offset from direction 2420 by an angular deviation of θ (e.g., an angular deviation measured within the XY plane). Controller 2150 may then wait for nanotubes 2310 to grow at least an interstitial distance in the second lateral direction 2620. This causes nanotubes 2310 to grow back towards the interstices that were originally penetrated in FIG. 23, but without running directly into themselves or a catalyst 1810. By the time growth is completed in direction 2620, ends 2312 of nanotubes 2310 are aligned under new interstices which are different from those that were penetrated in FIG. 25. In this example, ends 2312 are grown until they reach interstices underneath which carbon nanotubes 2310 were originally grown. Controller 2150 proceeds to align electrical field 2172 in first vertical direction 2320 as shown in FIG. 27, and grows carbon nanotubes 2310 back up through sheets 100 and 1900, again penetrating interstices 130 and 1930 and completing a stitch. FIG. 28 illustrates further growing operations that may be performed by adjusting the alignment of electric field 2172 (e.g., during growth) such that each end 2312 grows/"corkscrews" around other nanotubes in region 2830. This proceeds to tie off nanotubes 2310 after nanotubes 2310 have formed a complete loop of nanotubes 2810 and 2820, securing sheets 100 and 1900 in place. In further embodiments, nanotubes 2310 may be tied off onto themselves, or nanotubes in sheet 100 or 1900. For example, controller 2150 may, for each new carbon nanotube 2310, direct actuator 2180 to adjust alignment of electrical field 2172 such that an end 2312 of each new carbon nanotube 2310 is grown around that carbon nanotube 2310.

In a further embodiment, sheets 100 and 1900 may further be bonded together by heating sheets 100 and 1900 after CVD growth has completed. For example, the nanotubes may be heated to a high temperature such as 650° C. This causes any nanotubes which are touching each other to sinter together, forming junctions that further secure sheets 100 and 1900 to each other.

Figure 29:
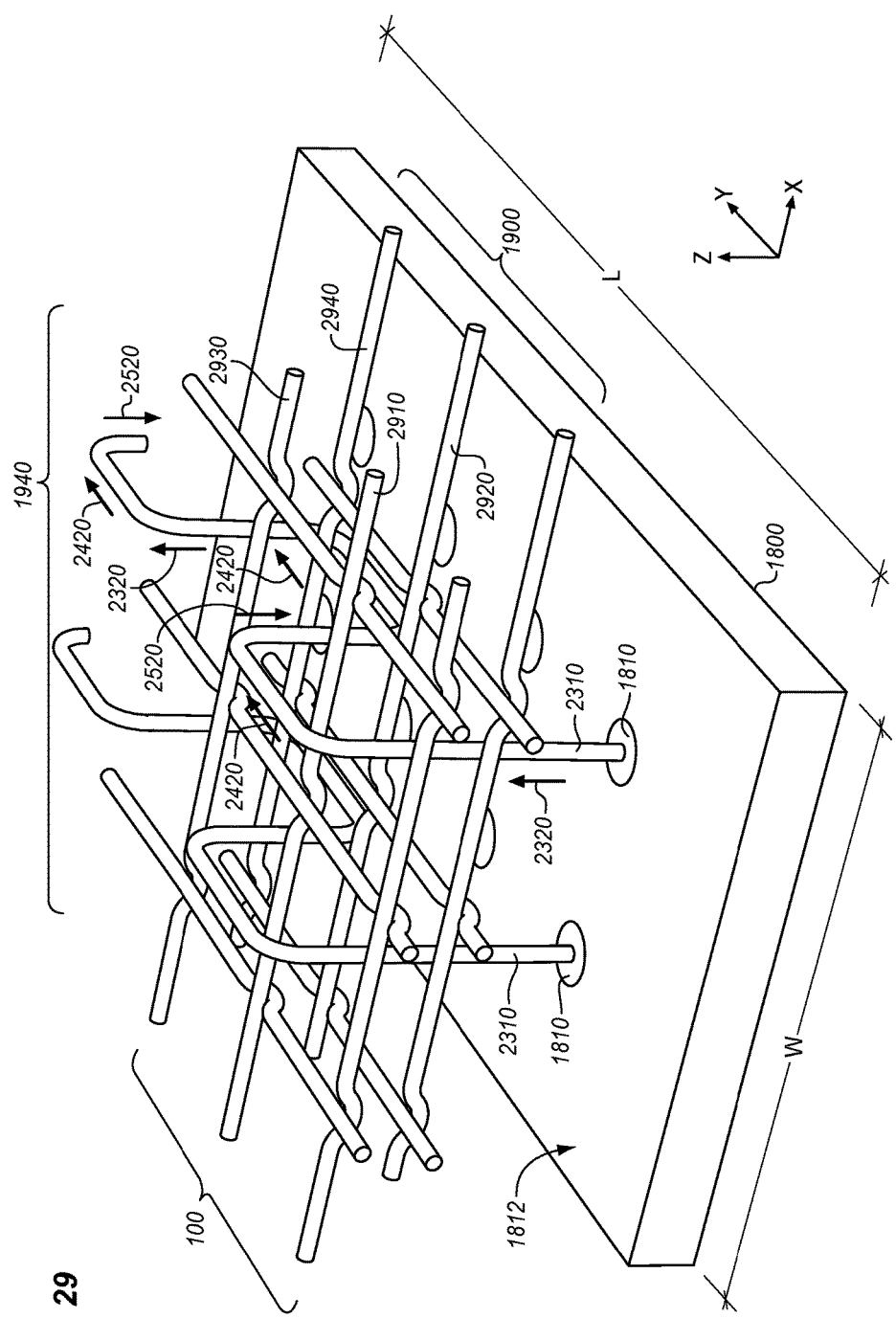
FIG. 29 is a diagram illustrating growth of nanotubes in an alternative manner that stitches together sheets of nanotubes in an exemplary embodiment

FIG. 29 is a diagram illustrating growth of nanotubes in an alternative manner that stitches together sheets of nanotubes in an exemplary embodiment. According to FIG. 9, only one row of catalysts 1810 is included at stitching region 1940. Controller 2150 proceeds to iteratively: align electrical field 2172 in a first vertical direction 2320 to grow carbon nanotubes 2310 through interstices 130 and 1930, then align electrical field 2172 in lateral direction 2420, followed by aligning electrical field 2172 in second vertical direction 2520 to grow nanotubes 2310 back through the interstices, followed by aligning electrical field 2172 in lateral direction 2420 in a repeating cycle, causing nanotubes 2310 to weave through interstices at sheets 100 and 1900 as growth continues horizontally in direction 2420. This allows a single row of carbon nanotubes to stitch sheets 100 and 1900 together.

EXAMPLES

Figure 30:
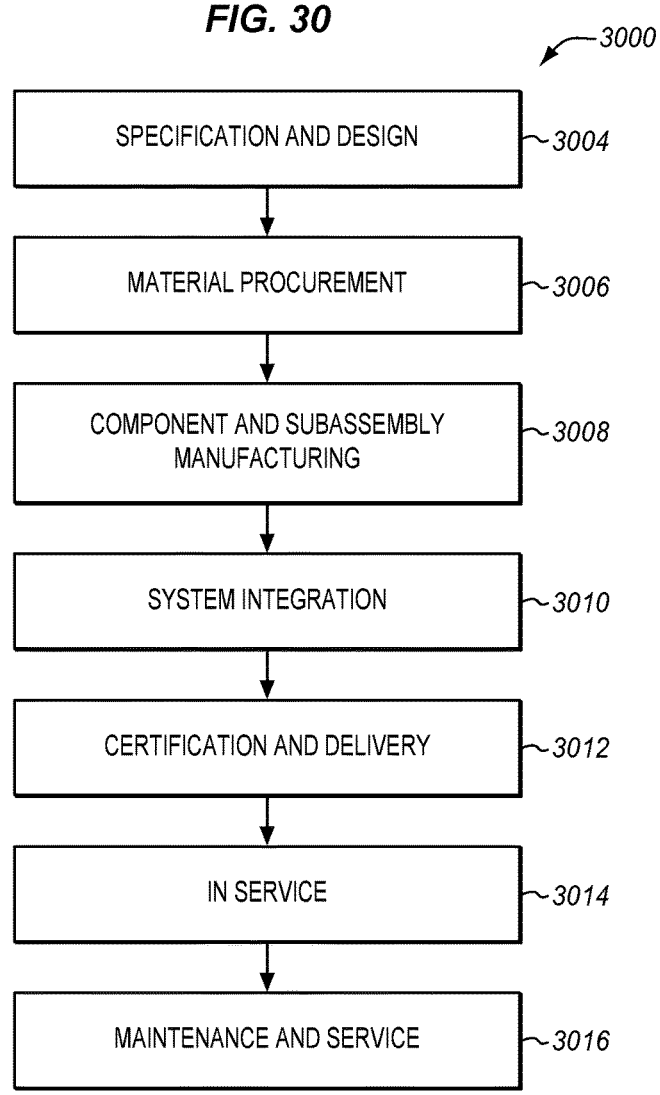
FIG. 30 is a flow diagram of aircraft production and service methodology in an exemplary embodiment.
Figure 31:
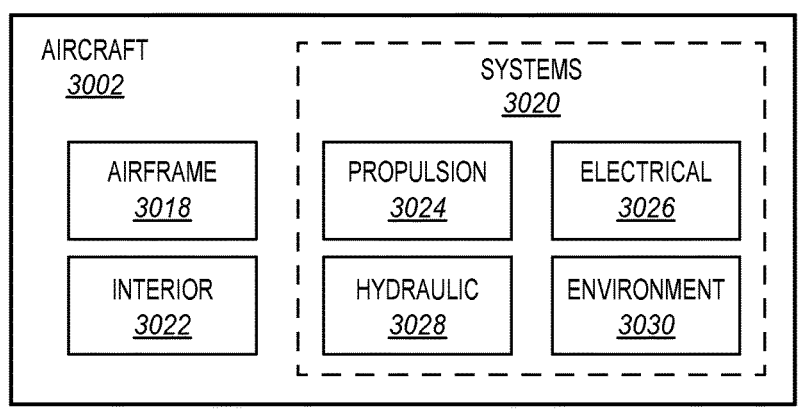
FIG. 31 is a block diagram of an aircraft in an exemplary embodiment.

Referring more particularly to the drawings, embodiments of the disclosure may be described in the context of an aircraft manufacturing and service method 3000 as shown in FIG. 30 and an aircraft 3002 as shown in FIG. 31. During pre-production, exemplary method 3000 may include specification and design 3004 of the aircraft 3002 and material procurement 3006. During production, component and subassembly manufacturing 3008 and system integration 3010 of the aircraft 3002 takes place. Thereafter, the aircraft 3002 may go through certification and delivery 3012 in order to be placed in service 3014. While in service by a customer, the aircraft 3002 is scheduled for routine maintenance and service 3016 (which may also include modification, reconfiguration, refurbishment, and so on).

Each of the processes of method 3000 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 31, the aircraft 3002 produced by exemplary method 3000 may include an airframe 3018 with a plurality of systems 3020 and an interior 3022. Examples of high-level systems 3020 include one or more of a propulsion system 3024, an electrical system 3026, a hydraulic system 3028, and an environmental system 3030. Any number of other systems may be included. Although an aerospace example is shown, the principles of the invention may be applied to other industries, such as the automotive industry.

Apparatus and methods embodied herein may be employed during any one or more of the stages of the production and service method 3000. For example, components or subassemblies corresponding to production stage 3008 may be fabricated or manufactured in a manner similar to components or subassemblies produced while the aircraft 3002 is in service. Also, one or more apparatus embodiments, method embodiments, or a combination thereof may be utilized during the production stages 3008 and 3010, for example, by substantially expediting assembly of or reducing the cost of an aircraft 3002. Similarly, one or more of apparatus embodiments, method embodiments, or a combination thereof may be utilized while the aircraft 3002 is in service, for example and without limitation, to maintenance and service 3016. For example, the techniques and systems described herein may be used for steps 3006, 3008, 3010, 3014, and/or 3016, and/or may be used for airframe 3018 and/or interior 3022, or even any of propulsion 3024, electrical 3026, environmental 3030, hydraulic 3028, or systems 3020 in general.

In one embodiment, sheet 100 of FIG. 1 comprises a portion of airframe 3018 (e.g., a portion of a composite part utilized for a wing of an aircraft), and is manufactured during component and subassembly manufacturing 3008. Sheet 100 may be stitched together with other sheets, and surrounded by a matrix of polymer in order to form a composite part for an aircraft in system integration 3010, and then be utilized in service 3014 until wear renders the part unusable. Then, in maintenance and service 3016, the part may be discarded and replaced with a newly manufactured part including a new sheet 100.

Any of the various control elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

The invention claimed is:

1. A method comprising:
   providing multiple sheets of interwoven carbon nanotubes that each form a repeating pattern;

arranging the sheets over a substrate such that interstices of the sheets overlap at a stitch region of the substrate;
heating catalysts at the substrate above a threshold temperature to trigger growth of new carbon nanotubes; and
adjusting alignment of an electrical field that defines a direction of growth of the new carbon nanotubes, thereby causing the new carbon nanotubes to grow through the interstices and then stitch the sheets together by encircling at least one carbon nanotube from each of the multiple sheets.

2. The method of claim 1 wherein:
adjusting alignment of the electrical field comprises:
aligning the electrical field in a first vertical direction to grow the new carbon nanotubes through the interstices, followed by aligning the electrical field in a first lateral direction, followed by aligning the electrical field in a second vertical direction to grow the new carbon nanotubes back through the interstices, followed by aligning the electrical field in a second lateral direction, followed by aligning the electrical field in the first vertical direction and completing a stitch.

3. The method of claim 2 further comprising:
waiting for the new carbon nanotubes to grow at least an interstitial distance after aligning the electrical field in the first lateral direction; and
waiting for the new carbon nanotubes to grow at least an interstitial distance after aligning the electrical field in the second lateral direction.

4. The method of claim 1 further comprising:
growing an end of each new carbon nanotube around another carbon nanotube.

5. The method of claim 1 further comprising:
for each new carbon nanotube, growing an end of the new carbon nanotube around the new carbon nanotube.

6. The method of claim 1 wherein:
adjusting alignment of the electrical field comprises iteratively:
aligning the electrical field to grow the new carbon nanotubes in a first vertical direction to grow the new carbon nanotubes through the interstices, followed by aligning the electrical field in a lateral direction, followed by aligning the electrical field in a second vertical direction to grow the new carbon nanotubes back through the interstices, followed by aligning the electrical field in the lateral direction.

7. The method of claim 1 further comprising:
placing the sheets and the substrate within a Chemical Vapor Deposition (CVD) furnace.

8. The method of claim 1 further comprising:
bracing the sheets arranged over the substrate.

9. A non-transitory computer readable medium embodying programmed instructions which, when executed by a processor, are operable for performing a method for stitching multiple sheets of interwoven carbon nanotubes that each form a repeating pattern, the multiple sheets arranged over a substrate such that interstices of the sheets partially overlap at a stitch region of the substrate, the method comprising:
heating catalysts at the substrate above a threshold temperature to trigger growth of new carbon nanotubes; and
adjusting alignment of an electrical field that defines a direction of growth of the new carbon nanotubes, thereby causing the new carbon nanotubes to grow through the interstices and then stitch the sheets together by encircling at least one carbon nanotube from each of the multiple sheets.

10. The medium of claim 9 wherein:
adjusting alignment of the electrical field comprises:
aligning the electrical field in a first vertical direction to grow the new carbon nanotubes through the interstices, followed by aligning the electrical field in a first lateral direction, followed by aligning the electrical field in a second vertical direction to grow the new carbon nanotubes back through the interstices, followed by aligning the electrical field in a second lateral direction, followed by aligning the electrical field in the first vertical direction and completing a stitch.

11. The medium of claim 10 wherein the method further comprises:
waiting for the new carbon nanotubes to grow at least an interstitial distance after aligning the electrical field in the first lateral direction; and
waiting for the new carbon nanotubes to grow at least an interstitial distance after aligning the electrical field in the second lateral direction.

12. The medium of claim 9 wherein the method further comprises:
growing an end of each new carbon nanotube around another carbon nanotube.

13. The medium of claim 9 wherein the method further comprises:
for each new carbon nanotube, growing an end of the new carbon nanotube around the new carbon nanotube.

14. The medium of claim 9 wherein:
adjusting alignment of the electrical field comprises iteratively:
aligning the electrical field to grow the new carbon nanotubes in a first vertical direction to grow the new carbon nanotubes through the interstices, followed by aligning the electrical field in a lateral direction, followed by aligning the electrical field in a second vertical direction to grow the new carbon nanotubes back through the interstices, followed by aligning the electrical field in the lateral direction.

15. The medium of claim 9 wherein the method further comprises:
placing the sheets and the substrate within a Chemical Vapor Deposition (CVD) furnace.

16. The medium of claim 9 wherein the method further comprises:
bracing the sheets arranged over the substrate.

17. A system comprising:
a substrate comprising multiple catalysts that grow carbon nanotubes, the substrate dimensioned to receive multiple sheets of interwoven carbon nanotubes that each form a repeating pattern, the multiple sheets having interstices that overlap at a stitch region of the substrate;
a heating device that heats catalysts at the substrate above a threshold temperature to trigger growth of new carbon nanotubes;
an electromagnetic source that generates an electrical field defining a direction of growth of the new carbon nanotubes;
an actuator that reorients the electromagnetic source; and
a controller that directs the actuator to adjust alignment of the electrical field as growth continues, thereby causing the new carbon nanotubes to grow through the interstices and then stitch the sheets together by encircling at least one carbon nanotube from each of the multiple sheets.

18. The system of claim 17 wherein:
the controller directs the actuator to engage in: aligning the electrical field in a first vertical direction to grow the new carbon nanotubes through the interstices, followed by aligning the electrical field in a first lateral direction, followed by aligning the electrical field in a second vertical direction to grow the new carbon nanotubes back through the interstices, followed by aligning the electrical field in a second lateral direction, followed by aligning the electrical field in the first vertical direction and completing a stitch.

19. The system of claim 18 wherein:
the controller waits for the new carbon nanotubes to grow at least an interstitial distance a after aligning the electrical field to grow the new carbon nanotubes in the first lateral direction; and
the controller waits for the new carbon nanotubes to grow at least an interstitial distance after aligning the electrical field to grow the new carbon nanotubes in the second lateral direction.

20. The system of claim 17 wherein:
the controller directs the actuator to adjust alignment of the electrical field such that ends of new carbon nanotubes grow around other carbon nanotubes.

21. The system of claim 17 wherein:
the controller directs the actuator to adjust alignment of the electrical field such that an end of each new carbon nanotubes grow around the new carbon nanotube.

22. The system of claim 17 wherein:
the controller directs the actuator to iteratively engage in:
aligning the electrical field to grow the new carbon nanotubes in a first vertical direction to grow the new carbon nanotubes through the interstices, followed by aligning the electrical field in a lateral direction, followed by aligning the electrical field in a second vertical direction to grow the new carbon nanotubes back through the interstices, followed by aligning the electrical field in the lateral direction.

23. The system of claim 17 wherein:
the catalysts are arranged along a first end of the substrate; and
the stitching region extends from the first end of the substrate to a second end of the substrate.

24. The system of claim 17 wherein:
the heating device comprises an electrically resistive heater.

25. The system of claim 17 wherein:
the heating device comprises a lighting system.

* * * * *